United States Patent
Kamada et al.

(10) Patent No.: US 9,958,472 B2
(45) Date of Patent: May 1, 2018

(54) INERTIAL SENSOR

(71) Applicant: HITACHI, LTD., Chiyoda-ku, Tokyo (JP)

(72) Inventors: Yuudai Kamada, Tokyo (JP); Atsushi Isobe, Tokyo (JP); Noriyuki Sakuma, Tokyo (JP); Takashi Oshima, Tokyo (JP); Yuki Furubayashi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 186 days.

(21) Appl. No.: 14/822,419

(22) Filed: Aug. 10, 2015

(65) Prior Publication Data

US 2016/0091524 A1    Mar. 31, 2016

(30) Foreign Application Priority Data

Sep. 30, 2014  (JP) ................................ 2014-201587

(51) Int. Cl.
*G01P 15/125* (2006.01)
*G01P 15/08* (2006.01)

(52) U.S. Cl.
CPC .... *G01P 15/125* (2013.01); *B81B 2203/0109* (2013.01); *G01P 2015/0831* (2013.01); *G01P 2015/0837* (2013.01)

(58) Field of Classification Search
CPC .................. G01P 15/125; G01P 2015/0831
See application file for complete search history.

(56) References Cited

U.S. PATENT DOCUMENTS

| 7,690,255 | B2 * | 4/2010 | Gogoi | G01P 15/0802 73/514.32 |
| 2007/0029629 | A1 | 2/2007 | Yazdi | |
| 2009/0320596 | A1 | 12/2009 | Classen et al. | |
| 2013/0192364 | A1 * | 8/2013 | Acar | G01C 19/5733 73/504.12 |
| 2014/0007685 | A1 * | 1/2014 | Zhang | G01P 15/125 73/514.32 |
| 2014/0230551 | A1 | 8/2014 | Kunimi et al. | |

FOREIGN PATENT DOCUMENTS

| JP | 2013-076610 A | 4/2013 |
| JP | 2014-102172 A | 6/2014 |

* cited by examiner

*Primary Examiner* — John Chapman, Jr.
(74) *Attorney, Agent, or Firm* — Miles & Stockbridge P.C.

(57) ABSTRACT

A low-noise and high-sensitivity inertial sensor is provided. On the assumption that a movable portion VU1 and a movable portion VU2 are formed in the same SOI layer, the movable portion VU1 and the movable portion VU2 are mechanically connected to each other by a mechanical coupling portion MCU even while these movable portions are electrically isolated from each other. Thereby, according to a sensor element SE in the invention, it is possible to further suppress a shift between the capacitance of a MEMS capacitor 1 and the capacitance of a MEMS capacitor 2.

5 Claims, 12 Drawing Sheets

INERTIAL SENSOR

TECHNICAL FIELD

The present invention relates to an inertial sensor, and relates to, for example, a technique effective in a case of application to an acceleration sensor that detects microvibrational acceleration.

BACKGROUND ART

JP-A-2013-076610 (PTL 1) discloses a technique relevant to an acceleration sensor including a C/V conversion circuit having an increase or decrease in capacitance with respect to acceleration by applying sinusoidal signals having opposite phases to a pair of capacitive elements.

JP-A-2014-102172 (PTL 2) discloses a technique relevant to an acceleration sensor including a C/V conversion circuit using a fully-differential operational amplifier (fully-differential operational amplifier). Specifically, an output signal from a pair of capacitive elements to which voltage signals having opposite phases are applied is input to the inverting input of the fully-differential operational amplifier, and an output signal from a pair of fixed capacitive elements having the same capacitance as that of the pair of capacitive elements mentioned above is input to the non-inverting input of the fully-differential operational amplifier.

CITATION LIST

Patent Literature

PTL 1: JP-A-2013-076610
PTL 2: JP-A-2014-102172

SUMMARY OF INVENTION

Technical Problem

A seismic reflection survey is a method in which reflected waves reflected from the reflection surface (boundary surface on which acoustic impedance changes) of the underground and returning to the ground by generating shock waves or continuous waves on the surface of the earth are measured by a geophone developed on the surface of the earth, and the depth distribution or the underground structure of an underground reflection surface is surveyed by analyzing the measured waves. For example, such a seismic reflection survey is widely used as a main method of surveying petroleum or natural gas. Particularly, as a sensor for next-generation seismic reflection survey, an acceleration sensor that detects acceleration which is much more microscopic than gravitational acceleration has attracted attention. In order to put such an acceleration sensor into practical use, the development of a low-noise and extremely-high-sensitivity acceleration sensor is required.

An object of the present invention is to provide a low-noise and high-sensitivity inertial sensor.

Other problems and novel features will be made clearer from the description and the accompanying drawings of the present specification.

Solution to Problem

According to an embodiment, there is provided an inertial sensor including a mass body which is displaceable in a predetermined direction, wherein the mass body is provided with a first movable portion including a conductor, a second movable portion, electrically isolated from the first movable portion, which includes a conductor, and a mechanical coupling portion that mechanically connects the first movable portion and the second movable portion. The inertial sensor includes a first fixed electrode which is disposed so as to be opposite to the first movable portion, a second fixed electrode which is disposed so as to be opposite to the first movable portion, a third fixed electrode which is disposed so as to be opposite to the second movable portion, and a fourth fixed electrode which is disposed so as to be opposite to the second movable portion. In this case, a first capacitor is formed by the first movable portion and the first fixed electrode, a second capacitor is formed by the first movable portion and the second fixed electrode, a third capacitor is formed by the second movable portion and the third fixed electrode, and a fourth capacitor is formed by the second movable portion and the fourth fixed electrode. Here, when the mass body is displaced in the predetermined direction, capacitance of one capacitor out of the first capacitor and the second capacitor increases, whereas capacitance of the other capacitor decreases, and capacitance of one capacitor of the third capacitor and the fourth capacitor increases, whereas capacitance of the other capacitor decreases.

Advantageous Effects of Invention

According to an embodiment, it is possible to provide a low-noise and high-sensitivity inertial sensor.

DESCRIPTION OF EMBODIMENTS

Figure 1:
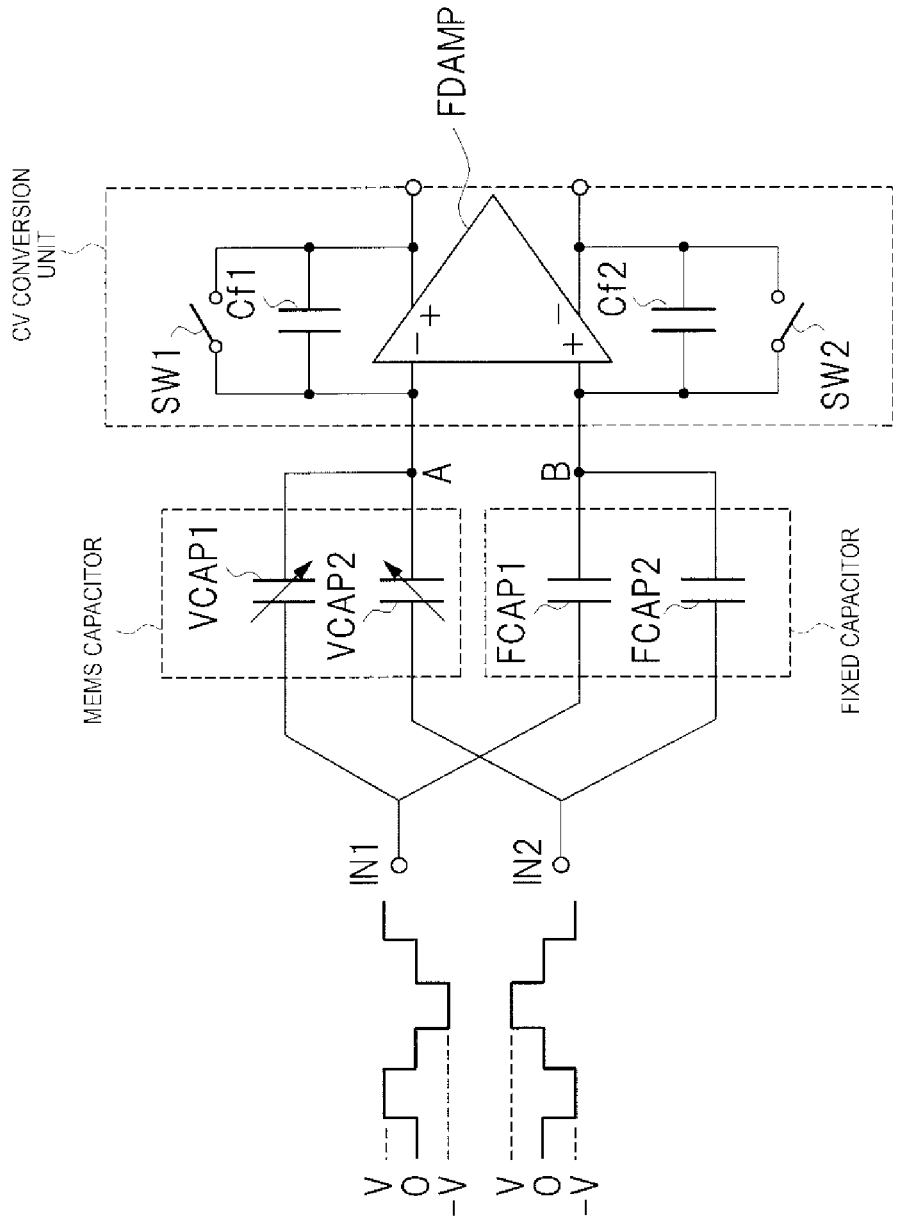
FIG. 1 is a schematic circuit diagram illustrating a configuration example of a CV conversion unit and a sensor unit of an acceleration sensor in an associated technique.

In the following embodiments, the invention will be described by division into a plurality of sections or embodiments, as necessary, for convenience. However, these sections or embodiments are not irrelevant to each other unless explicitly otherwise stated, and one section or embodiment is in relation to a modification example, details, supplementary explanation, or the like of all or a portion of other sections or embodiments.

In addition, in the following embodiments, when mention is made of the number of elements and the like (including the number of pieces, numerical values, amounts, ranges, and the like), the number of elements is not limited to a specific number except for a case where the number thereof is particularly specified, a case where the number thereof is apparently limited to the specific number in principle, and the like, and may be equal to or greater (or less) than the specific number.

Further, in the following embodiments, it goes without saying that components thereof (including element steps as well) are not necessarily indispensable except for a case where the components are particularly specified, a case where the components are considered to be apparently indispensable in principle, and the like.

Similarly, in the following embodiments, when mention is made of the shapes of the components, positional relations therebetween, and the like, the substantially approximate or similar shapes and the like are assumed to be included therein except for a case where they are particularly specified, a case where they are considered to be apparently excluded in principle. The same is true of the numerical values and the ranges described above.

In addition, in all the drawings illustrating the embodiments, the same members are denoted by the same reference numerals and signs in principle, and thus the repetitive description thereof will be omitted. Meanwhile, a plan view may be hatched in order to make the drawings easier to understand.

Embodiment 1

<Room for Improvement>

In the technique disclosed in PTL 1, a pair of variable capacitive elements having an increase or decrease in capacitance with respect to acceleration are used, and sinusoidal signals (input signals) having opposite phases are applied to the respective variable capacitive elements. Thereby, in the technique disclosed in PTL 1, on the basis of a change in capacitance occurring when the acceleration is applied, this change in capacitance is converted into a voltage signal by a CV conversion unit to finally obtain a detection signal corresponding to the acceleration. Incidentally, in the technique disclosed in PTL 1, when external noise is contained in an input signal, there may be a concern of this external noise adversely influencing the detection signal.

Consequently, for example, a technique for suppressing an adverse influence due to external noise includes an associated technique disclosed in PTL 2 shown below. Hereinafter, this associated technique will be described.

FIG. 1 is a schematic circuit diagram illustrating a configuration example of a CV conversion unit and a sensor unit of an acceleration sensor in, for example, an associated technique disclosed in PTL 2. In FIG. 1, the acceleration sensor in the associated technique includes an input terminal IN1 and an input terminal IN2. A variable capacitive element VCAP1 and a variable capacitive element VCAP2 are connected in series to each other between the input terminal IN1 and the input terminal IN2. Similarly, a fixed capacitive element FCAP1 and a fixed capacitive element FCAP2 are connected in series to each other between the input terminal IN1 and the input terminal IN2.

In this case, the variable capacitive element VCAP1 and the variable capacitive element VCAP2 are configured such that capacitance changes depending on acceleration which is applied from the outside, and constitute a MEMS capacitor which is formed in a MEMS (Micro Electrical Mechanical Systems) structure. On the other hand, the fixed capacitive element FCAP1 and the fixed capacitive element FCAP2 are formed in a semiconductor chip as, for example, a portion of an integrated circuit formed by a CMOS process.

An intermediate node A between the variable capacitive element VCAP1 and the variable capacitive element VCAP2 is connected to the inverting input terminal of a fully-differential operational amplifier (fully-differential operational amplifier) FDAMP constituting the CV conversion unit. On the other hand, an intermediate node B between the fixed capacitive element FCAP1 and the fixed capacitive element FCAP2 is connected to the non-inverting input terminal of the fully-differential operational amplifier FDAMP.

As shown in FIG. 1, a feedback capacitive element Cf1 and a switch SW1 are connected in parallel to each other between the inverting input terminal and the non-inverted output terminal of the fully-differential operational amplifier FDAMP. On the other hand, as shown in FIG. 1, a feedback capacitive element Cf2 and a switch SW2 are connected in parallel to each other between the non-inverting input terminal and the inverted output terminal of the fully-differential operational amplifier FDAMP.

In the associated technique which is configured in this manner, for example, as shown in FIG. 1, input voltages having opposite phases to each other are applied to the input terminal IN1 and the input terminal IN2. Here, for example, a case where external noise (Vz) is applied to the input voltage which is input to the input terminal IN1 is considered. When the capacitance of the variable capacitive element VCAP1 and the capacitance of the fixed capacitive element FCAP1 are the same "C", electric charge (CVz) caused by the external noise is applied to the variable capacitive element VCAP1 of the MEMS capacitor shown in FIG. 1, whereas in the configuration of the associated technique, electric charge (CVz) caused by the external noise is also applied to the fixed capacitive element FCAP1 shown in FIG. 1. In this case, in the associated technique, the electric charge (CVz) caused by the external noise which is applied to the variable capacitive element VCAP1 and the electric charge (CVz) caused by the external noise which is applied to the fixed capacitive element FCAP1 are canceled, and an item "CVz" which is a main item of the external noise is included in none of an output signal from the inverted output terminal of the fully-differential operational amplifier FDAMP and an output signal from the non-inverted output terminal thereof. Therefore, according to the configuration of the associated technique, it is considered to be able to provide an acceleration sensor which is not likely to be influenced by external noise.

Incidentally, for example, the variable capacitive element VCAP1 and the variable capacitive element VCAP2 are formed in a MEMS structure, whereas the fixed capacitive element FCAP1 and the fixed capacitive element FCAP2 are formed in a semiconductor chip having an integrated circuit formed therein. Here, the processing accuracy of the MEMS structure and the processing accuracy of the integrated circuit formed in a semiconductor chip are considerably different from each other. From this, in a case of design, for example, even when the capacitance of the variable capacitive element VCAP1 and the capacitance of the fixed capacitive element FCAP1 are designed to have the same capacitance "C", there is an increasing possibility of the capacitance of the variable capacitive element VCAP1 and the capacitance of the fixed capacitive element FCAP1 being different from each other, in real products, due to a difference (variation) in processing accuracy. For example, on the assumption that the capacitance of the variable capacitive element VCAP1 is "C1", and that the capacitance of the fixed capacitive element FCAP1 is "C2", a case where the external noise (Vz) is applied to the input voltage which is input to the input terminal IN1 is considered, as described above.

In this case, electric charge (C1Vz) caused by the external noise is applied to the variable capacitive element VCAP1 of the MEMS capacitor shown in FIG. 1, whereas electric charge (C2Vz) caused by the external noise is applied to the fixed capacitive element FCAP1 shown in FIG. 1. Therefore, in the associated technique, when the capacitance of the variable capacitive element VCAP1 and the capacitance of the fixed capacitive element FCAP1 are different from each other due to a difference in processing accuracy, the electric charge (C1Vz) caused by the external noise which is applied to the variable capacitive element VCAP1 and the electric charge (C2Vz) caused by the external noise which is applied to the fixed capacitive element FCAP1 are not completely canceled. This means an adverse influence of external noise on the output signal from the fully-differential operational amplifier FDAMP, in the associated technique. Therefore, in the associated technique, considering a difference in processing variation, it can be understood that there is room for improvement from the viewpoint of suppressing the influence of external noise.

Consequently, in Embodiment 1, the room for improvement present in the above-mentioned associated technique is researched. Hereinafter, the technical idea in Embodiment 1 researched will be described with reference to the accompanying drawings.

<Circuit Configuration of Acceleration Sensor in Embodiment 1>

Figure 2:
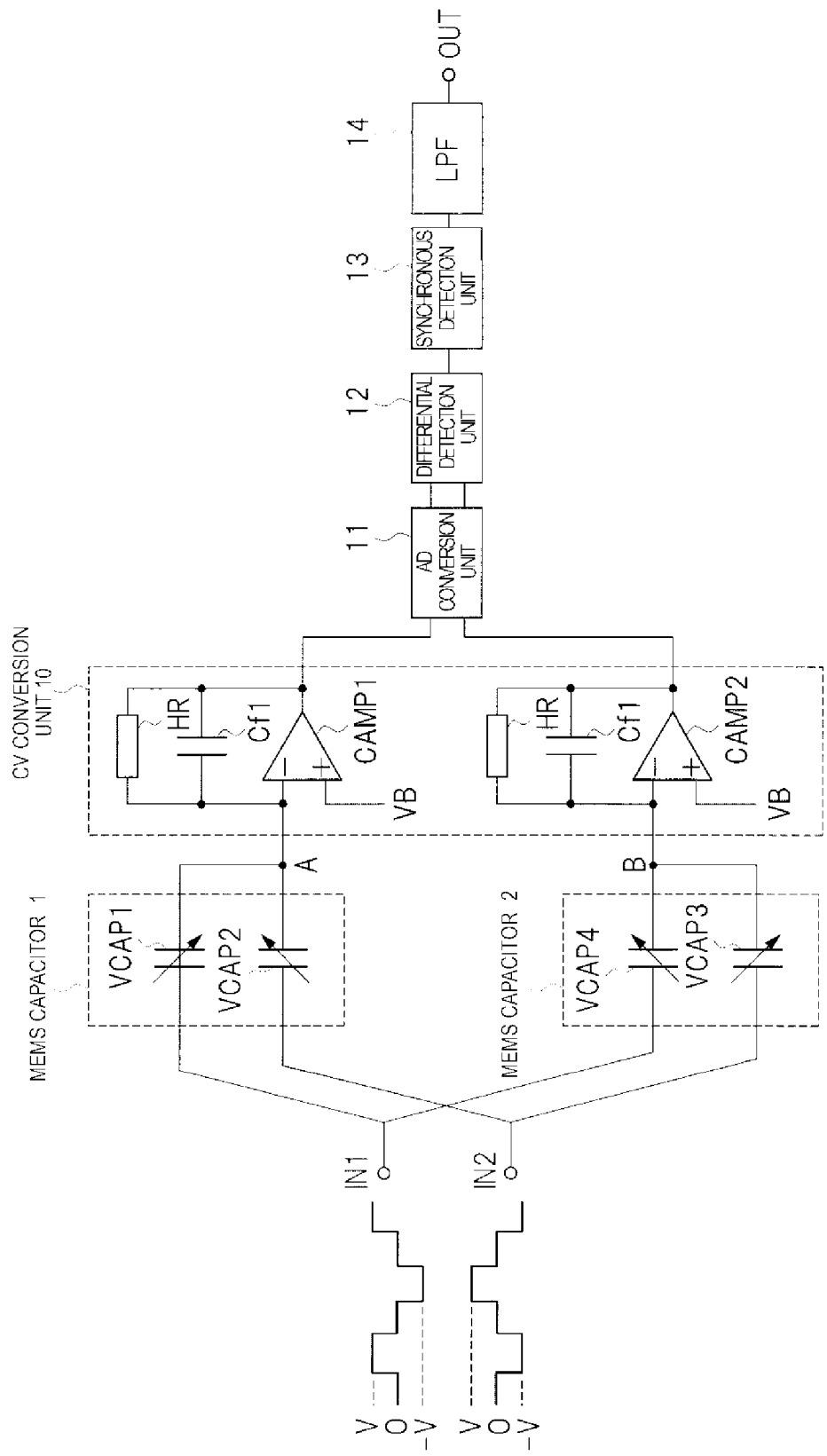
FIG. 2 is a diagram illustrating a schematic circuit configuration of an acceleration sensor in Embodiment 1.

FIG. 2 is a diagram illustrating a schematic circuit configuration of an acceleration sensor in Embodiment 1. As shown in FIG. 2, the acceleration sensor in Embodiment 1 includes an input terminal IN1 and an input terminal IN2. A variable capacitive element VCAP1 and a variable capacitive element VCAP2 are connected in series to each other between the input terminal IN1 and the input terminal IN2. Similarly, a variable capacitive element VCAP3 and a variable capacitive element VCAP4 are connected in series to each other between the input terminal IN1 and the input terminal IN2.

In this case, the variable capacitive element VCAP1 and the variable capacitive element VCAP2 are configured such that capacitance changes depending on acceleration which is applied from the outside, and constitute a MEMS capacitor 1 which is formed in a MEMS (Micro Electrical Mechanical Systems) structure. Similarly, a variable capacitive element VCAP3 and a variable capacitive element VCAP4 are configured such that capacitance changes depending on acceleration which is applied from the outside, and constitute a MEMS capacitor 2 which is formed in a MEMS structure.

Here, when acceleration in a specific direction is applied to the acceleration sensor in Embodiment 1, for example, the MEMS capacitor 1 is configured such that an increase in the capacitance of the variable capacitive element VCAP1 which is connected to the input terminal IN1 leads to a decrease in the capacitance of the variable capacitive element VCAP2 which is connected to the input terminal IN2. On the other hand, in this case, the MEMS capacitor 2 is configured such that an decrease in the capacitance of the variable capacitive element VCAP4 which is connected to the input terminal IN1 leads to an increase in the capacitance of the variable capacitive element VCAP3 which is connected to the input terminal IN2.

That is, when focusing on the MEMS capacitor 1, a change in the capacitance of the variable capacitive element VCAP1 and a change in the capacitance of the variable capacitive element VCAP2 have inverse characteristics to each other. Similarly, when focusing on the MEMS capacitor 2, a change in the capacitance of the variable capacitive element VCAP3 and a change in the capacitance of the variable capacitive element VCAP4 have inverse characteristics to each other. In addition, when focusing on a relationship between the MEMS capacitor 1 and the MEMS capacitor 2, a change in the capacitance of the variable capacitive element VCAP1 which is connected to the input terminal IN1 in the MEMS capacitor 1 and a change in the capacitance of the variable capacitive element VCAP4 which is connected to the input terminal IN1 in the MEMS capacitor 2 have inverse characteristics to each other. Similarly, a change in the capacitance of the variable capacitive element VCAP2 which is connected to the input terminal IN2 in the MEMS capacitor 1 and a change in the capacitance of the variable capacitive element VCAP3 which is connected to the input terminal IN2 in the MEMS capacitor 2 have inverse characteristics to each other.

Next, as shown in FIG. 2, an intermediate node A between the variable capacitive element VCAP1 and the variable capacitive element VCAP2 which constitute the MEMS capacitor 1 is connected to a CV conversion unit 10, and an intermediate node B between the variable capacitive element VCAP3 and the variable capacitive element VCAP4 which constitute the MEMS capacitor 2 are also connected to the CV conversion unit 10.

Specifically, the intermediate node A of the MEMS capacitor 1 is connected to, for example, the inverting input terminal of a charge amplifier CAMP1 which is constituted by a single-ended operational amplifier. A fixed potential VB (0 V) is applied to the non-inverting input terminal of the charge amplifier CAMP1. Further, a feedback capacitive element Cf1 and a high resistor HR are connected in parallel to each other between the inverting input terminal and the output terminal of the charge amplifier CAMP1.

On the other hand, the intermediate node B of the MEMS capacitor 2 is connected to, for example, the inverting input terminal of a charge amplifier CAMP2 which is constituted by a single-ended operational amplifier. A fixed potential VB (0 V) is applied to the non-inverting input terminal of the charge amplifier CAMP2. Further, a feedback capacitive element Cf1 and a high resistor HR are connected in parallel to each other between the inverting input terminal and the output terminal of the charge amplifier CAMP2.

Subsequently, as shown in FIG. 2, an AD conversion unit 11 that converts an analog signal into a digital signal is connected to the subsequent stage (output) of the CV conversion unit 10, and a differential detection unit 12 is connected to the subsequent stage (output) of the AD conversion unit 11. Further, a synchronous detection unit 13 is connected to the subsequent stage (output) of the differential detection unit 12, and an LPF (low-pass filter) 14 is connected to the subsequent stage (output) of the synchronous detection unit 13. The LPF 14 is connected to an output terminal OUT.

<Operation of Acceleration Sensor in Embodiment 1>

The acceleration sensor in Embodiment 1 is configured as described above. Hereinafter, the operations thereof will be described with reference to FIG. 2.

First, as shown in FIG. 2, opposite-phase modulation signals having phases different from each other by 180 degrees are applied to the input terminal IN1 and the input terminal IN2, respectively. For example, in principle, a capacitance change in a variable capacitive element which is caused by acceleration is detected even when a modulation signal is not applied, thereby allowing the acceleration to be detected. However, a detection signal based on the capacitance change in the variable capacitive element corresponding to the acceleration is a low-frequency signal, and thus has a tendency to be influenced by 1/f noise. That is, in a configuration in which the detection signal based on the capacitance change in the variable capacitive element corresponding to the acceleration is used as it is, the 1/f noise becomes larger, which results in a deterioration in S/N ratio, and a decrease in the detection sensitivity of the acceleration sensor. Consequently, in Embodiment 1, a modulation signal is used. In this case, the detection signal based on the capacitance change in the variable capacitive element corresponding to the acceleration is modulated into a modulation signal and serves as a high-frequency signal, and thus is not likely to be influenced by 1/f noise. That is, in the high-frequency signal, since the 1/f noise becomes smaller than in the low-frequency signal, it is possible to improve the S/N ratio, and to thus improve the detection sensitivity of the acceleration sensor. From such a reason, in Embodiment 1, modulation signals are applied to the input terminal IN1 and the input terminal IN2.

Subsequently, the reason for applying modulation signals having opposite phases to each other to the input terminal IN1 and the input terminal IN2 will be described. In FIG. 2, focusing on the MEMS capacitor 1, the capacitances of the variable capacitive element VCAP1 and the variable capacitive element VCAP2 are set to "C". When acceleration is applied, the capacitance of the variable capacitive element VCAP1 increases to "C+ΔC", whereas the capacitance of the variable capacitive element VCAP2 decreases to "C−ΔC". In this case, when modulation signals having opposite phases to each other are applied to the input terminal IN1 and the input terminal IN2, electric charge of Q1=(C+ΔC)V is stored in the variable capacitive element VCAP1, whereas electric charge of Q2=−(C−ΔC)V is stored in the variable capacitive element VCAP2. Therefore, the amount of charge transfer in the MEMS capacitor 1 is set to (C+ΔC)V−(C−ΔC)V=2ΔCV. That is, when the modulation signals having opposite phases to each other are applied to the input terminal IN1 and the input terminal IN2, the capacitance "C" of the variable capacitive element VCAP1 and the capacitance "C" of the variable capacitive element VCAP2 are canceled, and only a component of a capacitance change (ΔC) caused by the acceleration is contained in the amount of charge transfer. As a result, in the amount of charge transfer, the capacitance "C" irrelevant to the capacitance change (ΔC) caused by the acceleration is canceled, which results in the extraction of the amount of charge transfer corresponding to the capacitance change (ΔC), and thus it is possible to improve the detection sensitivity of the acceleration sensor. From such a reason, Embodiment 1 is configured such that modulation signals having opposite phases to each other are applied to the input terminal IN1 and the input terminal IN2.

On the assumption of the above, the operations of the acceleration sensor in Embodiment 1 will be described. In FIG. 2, opposite-phase modulation signals having phases different from each other by 180 degrees are applied to the input terminal IN1 and the input terminal IN2, respectively. Here, by acceleration being applied, the capacitance of the variable capacitive element VCAP1 in the MEMS capacitor 1 increases to "C+ΔC", whereas the capacitance of the variable capacitive element VCAP2 in the MEMS capacitor 2 decreases to "C−ΔC". In this case, the capacitance of the variable capacitive element VCAP4 in the MEMS capacitor 2 decreases to "C−ΔC", whereas the capacitance of the variable capacitive element VCAP3 in the MEMS capacitor 2 increases to "C+ΔC".

As a result, first, the amount of charge transfer in the MEMS capacitor 1 is set to (C+ΔC)V−(C−ΔC)V=2ΔCV, and when the capacitance of the feedback capacitive element Cf1 is set to "Cf", a first analog voltage signal which is represented by "2ΔCV/Cf" is output from the CV conversion unit 10.

Similarly, the amount of charge transfer in the MEMS capacitor 2 is set to (C−ΔC)V−(C+ΔC)V=−2ΔCV, and when the capacitance of the feedback capacitive element Cf1 is set to "Cf", a second analog voltage signal which is represented by "−2ΔCV/Cf" is output from the CV conversion unit 10.

The first analog voltage signal is converted into a first digital voltage signal by the AD conversion unit 11, and the second analog voltage signal is converted into a second digital voltage signal by the AD conversion unit 11. Thereafter, a difference between the first digital voltage signal and the second digital voltage signal is calculated by the differential detection unit 12, and a demodulated signal is extracted by the synchronous detection unit 13. Subsequently, the demodulated signal demodulated by the synchronous detection unit 13 passes through the LPF (low-frequency bandpass filter) 14, and thus finally, an acceleration signal (detection signal) corresponding to acceleration is output from the output terminal OUT.

In this manner, according to the acceleration sensor in Embodiment 1, it is possible to detect acceleration in a specific direction.

Modification Example

Figure 3:
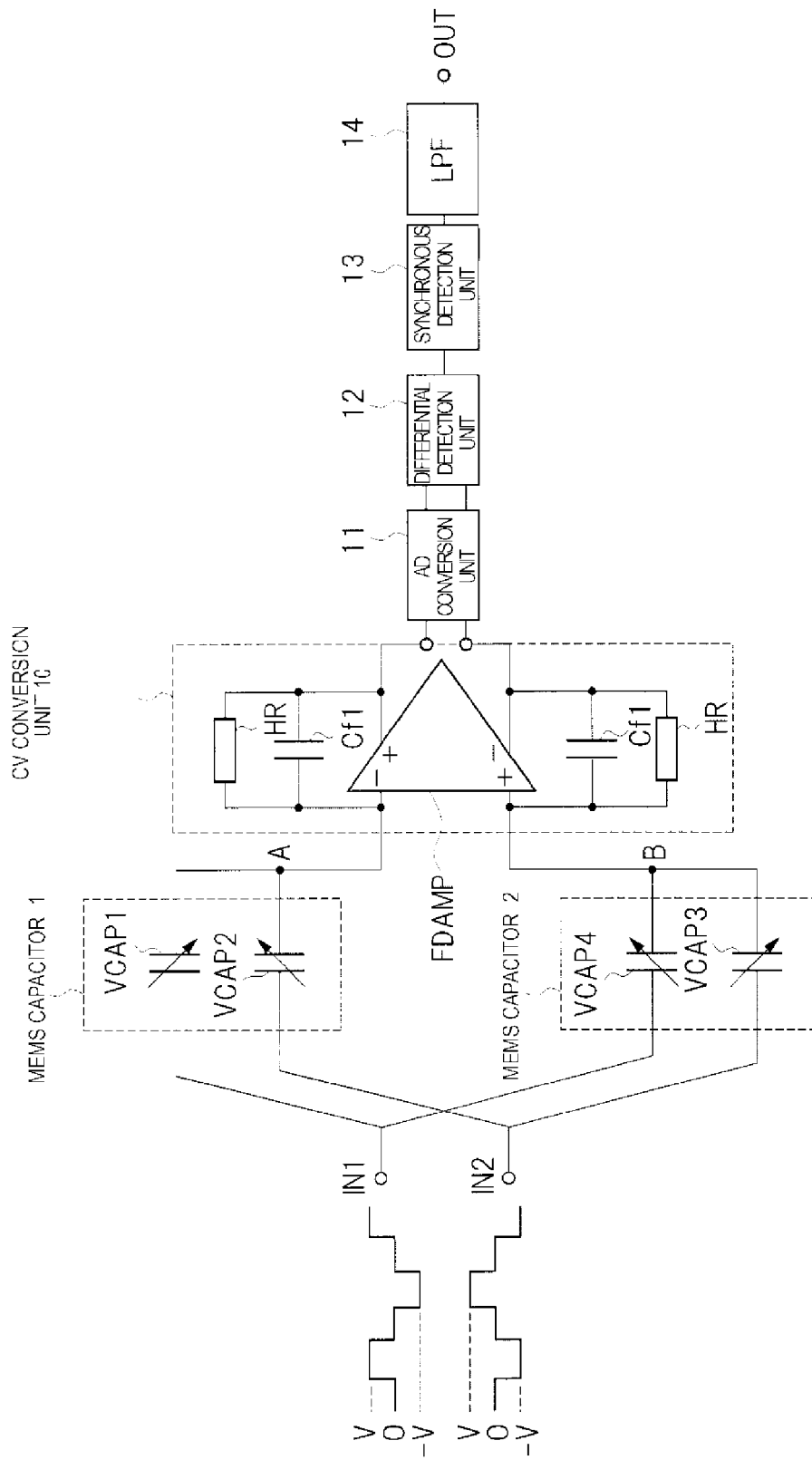
FIG. 3 is a diagram illustrating a modification example of the circuit configuration shown in FIG. 2.

FIG. 3 is a diagram illustrating a modification example of the circuit configuration shown in FIG. 2. In FIG. 3, as a component of a CV conversion unit 10, a fully-differential operational amplifier FDAMP is used. That is, in the circuit configuration shown in FIG. 2, the CV conversion unit 10 is constituted by the charge amplifier CAMP1 and the charge amplifier CAMP2 which are constituted by a single-ended operational amplifier. On the other hand, in a circuit configuration shown in FIG. 3, the CV conversion unit 10 is constituted by one fully-differential operational amplifier FDAMP. In this manner, in an acceleration sensor in Embodiment 1, the CV conversion unit 10 can also be constituted by the circuit configuration shown in FIG. 2, and the CV conversion unit 10 can also be constituted by the circuit configuration shown in FIG. 3 without being limited thereto.

Feature in Embodiment 1

Subsequently, features in Embodiment 1 will be described. In FIG. 2, a first feature in Embodiment 1 is in that the MEMS capacitor 1 constituted by the variable capacitive element VCAP1 and the variable capacitive element VCAP2 is provided between the input terminal IN1 and the input terminal IN2, and that the MEMS capacitor 2 constituted by the variable capacitive element VCAP3 and the variable capacitive element VCAP4 is provided therebetween. That is, the acceleration sensor in Embodiment 1 has a feature in that the sensor is provided with two sets of MEMS capacitors (MEMS capacitor 1 and MEMS capacitor 2) which are constituted by a MEMS structure having a change in capacitance due to acceleration. Thereby, since both the two sets of MEMS capacitors are constituted by a MEMS structure, any of the MEMS capacitors can be formed with the processing accuracy of a MEMS structure, and thus it is possible to reduce a manufacturing variation between the two sets of MEMS capacitors. As a result, according to the acceleration sensor in Embodiment 1, it is possible to obtain an effect capable of reducing the adverse influence of external noise.

Hereinafter, such a point will be described. For example, in the above-mentioned associated technique, as shown in FIG. 1, the MEMS capacitor and the fixed capacitor are formed between the input terminal IN1 and the input terminal IN2. In this case, the MEMS capacitor is constituted by a MEMS structure, and is formed with the processing accuracy of a MEMS structure, whereas the fixed capacitor is formed in a semiconductor chip having an integrated circuit formed therein, and is formed with the processing accuracy of a CMOS process. Regarding this point, the processing accuracy of a MEMS structure and the processing accuracy of a CMOS process are considerably different from each other, and thus in the associated technique, the manufacturing variations (processing accuracies) of the MEMS capacitor and the fixed capacitor are considerably different from each other.

From this, in the associated technique, the capacitance of the variable capacitive element VCAP1 and the capacitance of the fixed capacitive element FCAP1, for example, shown in FIG. 1 are different from each other due to a difference in processing accuracy between the MEMS capacitor and the fixed capacitor. Specifically, the capacitance of the variable capacitive element VCAP1 is set to "C1", and the capacitance of the fixed capacitive element FCAP1 is set to "C2". In such a situation, for example, when the external noise (Vz) is applied to a modulation signal which is input to the input terminal IN1, the electric charge (C1Vz) caused by the external noise is applied to the variable capacitive element VCAP1, whereas the electric charge (C2Vz) caused by the external noise is applied to the fixed capacitive element FCAP1. In this case, since "C1" and "C2" are different from each other, the electric charge (C1Vz) which is applied to the variable capacitive element VCAP1 and the electric charge (C2Vz) which is applied to the fixed capacitive element FCAP1 are different from each other. That is, in the associated technique, since methods of manufacturing the MEMS capacitor and the fixed capacitor are different from each other, the manufacturing variations (processing accuracies) of the MEMS capacitor and the fixed capacitor become larger, which results in the electric charge (C1Vz) caused by the external noise which is applied to the variable capacitive element VCAP1 and the electric charge (C2Vz) caused by the external noise which is applied to the fixed capacitive element FCAP1 not being completely canceled even when the fixed capacitor is provided. This means an adverse influence of external noise on the output signal from the CV conversion unit 10, in the associated technique. Therefore, in the associated technique, considering a difference in processing variation (difference in processing accuracy), the influence of the external noise is not able to be fully excluded. When the influence of the external noise increases, the magnitude of the noise in relation to a signal becomes larger. This means that an S/N ratio deteriorates in the associated technique, which leads to a decrease in the detection sensitivity of acceleration.

On the other hand, in the acceleration sensor in Embodiment 1, the MEMS capacitor and the fixed capacitor are not provided between the input terminal IN1 and the input terminal IN2 unlike the associated technique, and the two sets of MEMS capacitors (MEMS capacitor 1 and MEMS capacitor 2) which are constituted by a MEMS structure are provided therebetween. Thereby, in the acceleration sensor in Embodiment 1, since both the two sets of MEMS capacitors are constituted by a MEMS structure, any of the MEMS capacitors can be formed with the processing accuracy of a MEMS structure, and thus it is possible to reduce a manufacturing variation between the two sets of MEMS capacitors. That is, according to Embodiment 1, the MEMS capacitor and the fixed capacitor which are formed using techniques having processing accuracies considerably different from each other are not adopted unlike the associated technique, and two sets of MEMS capacitors (MEMS capacitor 1 and MEMS capacitor 2) which are formed using techniques having the same processing accuracies as each other are adopted. Therefore, it is possible to reduce a difference in manufacturing variation between the two sets of MEMS capacitors (MEMS capacitor 1 and MEMS capacitor 2).

For example, since techniques having the same processing accuracy are used even in a case where a manufacturing variation occurs in the MEMS capacitor, it can be considered that capacitance can be shifted to the same level as in the two sets of MEMS capacitors. In this case, the influence of the external noise decreases. Specifically, since techniques having the same processing accuracy are used, it is considered that a shift to the same level occurs, for example, even in a case where a shift from the design value of capacitance occurs. That is, for example, when the capacitance of the variable capacitive element VCAP1 is changed from the design value "C" to "C1", it is assumed that the capacitance of the variable capacitive element VCAP4 is also changed from the design value "C" to the same "C1". In such a situation, when the external noise (Vz) is applied to the modulation signal which is input to the input terminal IN1, the electric charge (C1Vz) caused by the external noise is applied to the variable capacitive element VCAP1, whereas the electric charge (C1Vz) caused by the external noise is also applied to the variable capacitive element VCAP4. In this case, since the capacitance "C1" of the variable capacitive element VCAP1 and the capacitance "C1" of the variable capacitive element VCAP4 are equal to each other, the electric charge (C1Vz) which is applied to the variable capacitive element VCAP1 and the electric charge (C1Vz) which is applied to the variable capacitive element VCAP4 become equal to each other. That is, in Embodiment 1, a manufacturing technique of the same processing accuracy is used in the processing of two sets of MEMS capacitors (MEMS capacitor 1 and MEMS capacitor 2), and thus a manufacturing variation (processing accuracy) between the two sets of MEMS capacitors becomes smaller. As a result, according to the acceleration sensor in Embodiment 1, even when the external noise (Vz) is applied under a situation where a capacitance value shifts from a design value, an output signal component based on the electric charge (C1Vz) caused by the external noise which is applied to the variable capacitive element VCAP1 and an output signal component based on the electric charge (C1Vz) caused by the external noise which is applied to the variable capacitive element VCAP4 are canceled. This means that the influence of the external noise can be reduced in Embodiment 1.

Therefore, the acceleration sensor in Embodiment 1 is configured to be capable of fully excluding the influence of the external noise even when a processing variation is present. In other words, according to Embodiment 1, it is possible to provide an excellent acceleration sensor which is highly resistant to external noise. A reduction in the influence of external noise means that the magnitude of noise in relation to a signal becomes smaller. Thereby, according to Embodiment 1, it is possible to realize a high-sensitivity acceleration sensor having a high S/N ratio.

Next, a second feature in Embodiment 1 is in that, as shown in FIG. 2, a signal which is output from the CV conversion unit 10 increases by providing two sets of MEMS capacitors (MEMS capacitor 1 and MEMS capacitor 2).

For example, in FIG. 2, a case is considered in which the MEMS capacitor 1, and the fixed capacitor (see FIG. 1) instead of the MEMS capacitor 2 are provided between the input terminal IN1 and the input terminal IN2. In this case, when acceleration is applied, the capacitance of the MEMS capacitor 1 first changes. Specifically, for example, the capacitance of the variable capacitive element VCAP1 is set to "C+ΔC", and the capacitance of the variable capacitive element VCAP2 is set to "C−ΔC". As a result, the amount of charge transfer of (C+ΔC)V−(C−ΔC)V=2ΔCV occurs in the entire MEMS capacitor 1. Thereby, when the capacitance of the feedback capacitive element is set to "Cf", a first output signal (first voltage signal) of 2ΔCV/Cf is output from the CV conversion unit 10. On the other hand, even when the acceleration is applied, the capacitance of the fixed capacitor does not change. As a result, the amount of charge transfer of the fixed capacitor is "0". Thereby, when the capacitance of the feedback capacitive element is set to "Cf", a second output signal (second voltage signal) of "0" is output from the CV conversion unit 10. From this, when the fixed capacitor is used instead of the MEMS capacitor 2, the relation of the first output signal−the second output signal=2ΔCV/Cf is established.

On the other hand, in Embodiment 1, as shown in FIG. 2, the MEMS capacitor 1 and the MEMS capacitor 2 are provided between the input terminal IN1 and the input terminal IN2. In this case, when acceleration is applied, the capacitance of the MEMS capacitor 1 first changes. Specifically, for example, the capacitance of the variable capacitive element VCAP1 is set to "C+ΔC", and the capacitance of the variable capacitive element VCAP2 is set to "C−ΔC". As a result, the amount of charge transfer of (C+ΔC)V−(C−ΔC)V=2ΔCV occurs in the entire MEMS capacitor 1. Thereby, when the capacitance of the feedback capacitive element is set to "Cf", a first output signal (first voltage signal) of 2ΔCV/Cf is output from the CV conversion unit 10. Similarly, the capacitance of the MEMS capacitor 2 also changes. Specifically, for example, the capacitance of the variable capacitive element VCAP4 is set to "C−ΔC", and the capacitance of the variable capacitive element VCAP3 is set to "C+ΔC". As a result, the amount of charge transfer of (C−ΔC)V−(C+ΔC)V=−2ΔCV occurs in the entire MEMS capacitor 2. Thereby, when the capacitance of the feedback capacitive element is set to "Cf", a second output signal (second voltage signal) of −2ΔCV/Cf is output from the CV conversion unit 10. From this, as in Embodiment 1, when the two sets of MEMS capacitors (MEMS capacitor 1 and MEMS capacitor 2) are provided, the relation of the first output signal−the second output signal=4ΔCV/Cf is established.

Therefore, according to the acceleration sensor in Embodiment 1, the magnitude of the signal (first output signal−second output signal) which is output from the CV conversion unit 10 becomes larger than in a case where the fixed capacitor is provided instead of the MEMS capacitor 2. This means that, according to Embodiment 1, an output signal caused by acceleration increases. Thereby, it is possible to increase an S/N ratio.

From the above, according to the acceleration sensor in Embodiment 1, an S/N ratio can be improved by a synergistic effect between a point that the external noise can be reduced by the above-mentioned first feature and a point that the magnitude of a signal can be increased by the above-mentioned second feature. As a result, according to Embodiment 1, it is possible to realize a high-sensitivity acceleration sensor having a high S/N ratio.

In Embodiment 1, a manufacturing technique of the same processing accuracy is used in the processing of two sets of MEMS capacitors (MEMS capacitor 1 and MEMS capacitor 2), and thus a manufacturing variation (processing accuracy) between the two sets of MEMS capacitors is reduced. Further, in Embodiment 1, in order to reduce the processing variation of the two sets of MEMS capacitors (MEMS capacitor 1 and MEMS capacitor 2), a device structure of the MEMS structure (sensor element) having the MEMS capacitor 1 and the MEMS capacitor 2 formed therein is researched. Hereinafter, first, the device structure of the sensor element having two sets of MEMS capacitors (MEMS capacitor 1 and MEMS capacitor 2) formed therein will be described, and then features of the device structure of the sensor element in Embodiment 1 will be described.

<Device Structure of Sensor Element in Embodiment 1>

Figure 4:
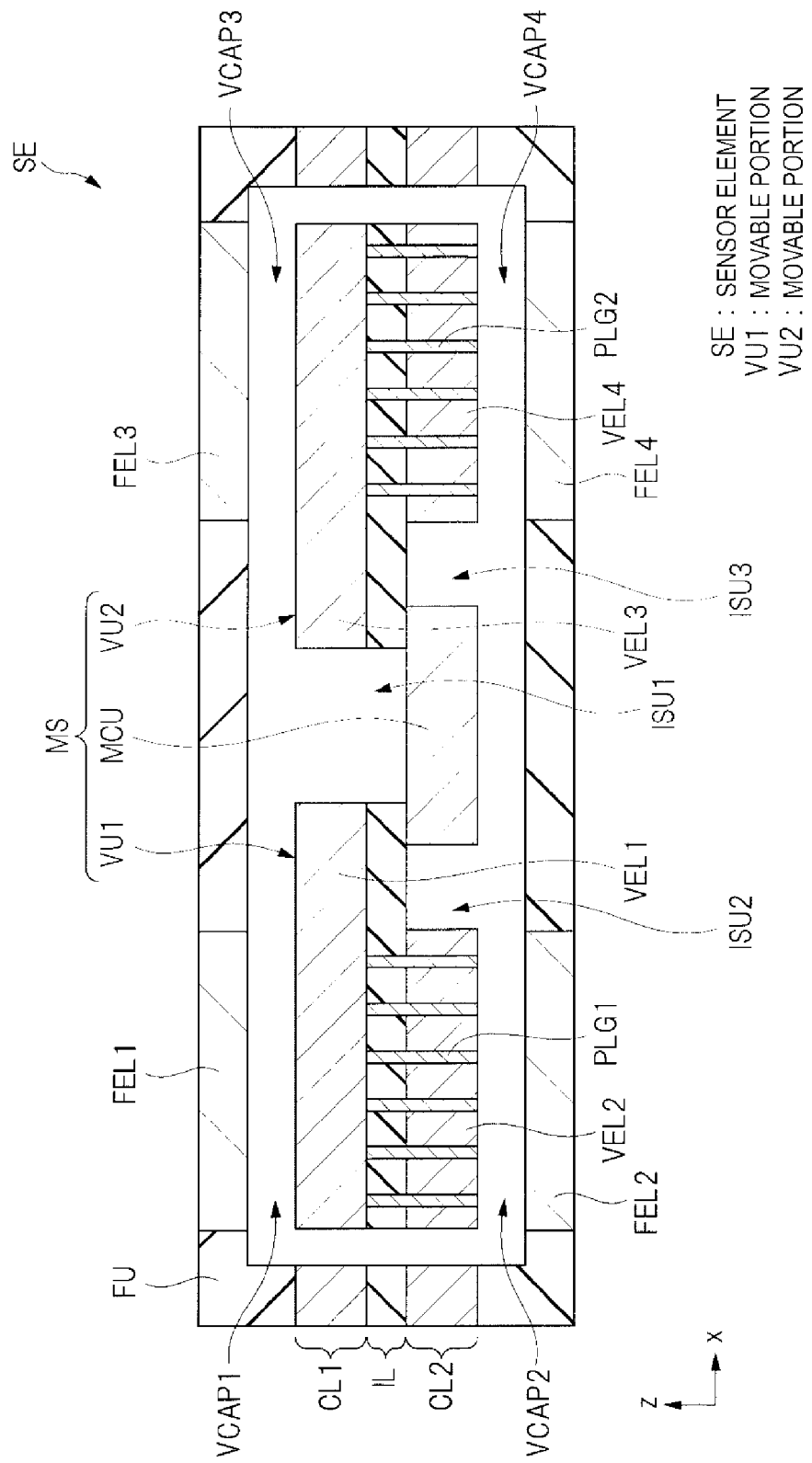
FIG. 4 is a cross-sectional view illustrating a device structure of a sensor element of the acceleration sensor in Embodiment 1.

FIG. 4 is a cross-sectional view illustrating a device structure of a sensor element SE of the acceleration sensor in Embodiment 1. In FIG. 4, the sensor element SE in Embodiment 1 includes a mass body MS which is displaced with respect to acceleration in a z-direction. This mass body MS includes a movable portion VU1, a movable portion VU2 which is electrically isolated from the movable portion VU1, and a mechanical coupling portion MCU which mechanically connects the movable portion VU1 to the movable portion VU2.

The mass body MS is formed in an SOI layer which is constituted by an insulating layer IL, a conductor layer CL1 which is formed on the surface of the insulating layer IL, and a conductor layer CL2 which is formed on the rear surface of the insulating layer IL. For example, the conductor layer CL1 and the conductor layer CL2 are formed from a semiconductor layer made of silicon, and the insulating layer IL is formed from a silicon oxide film.

Specifically, the movable portion VU1 includes a movable electrode VEL1 which is formed by processing the conductor layer CL1 and a movable electrode VEL2 which is formed by processing the conductor layer CL2. That is, the insulating layer IL is formed so as to be interposed between the movable electrode VEL1 and the movable electrode VEL2, and the movable electrode VEL1 and the movable electrode VEL2 are electrically connected to each other by a plug PLG1 passing through the insulating layer IL.

Similarly, the movable portion VU2 includes a movable electrode VEL3 which is formed by processing the conductor layer CL1 and a movable electrode VEL4 which is formed by processing the conductor layer CL2. That is, the insulating layer IL is formed so as to be interposed between the movable electrode VEL3 and the movable electrode VEL4, and the movable electrode VEL3 and the movable electrode VEL4 are electrically connected to each other by a plug PLG2 passing through the insulating layer IL.

An isolation portion ISU1 is formed in the conductor layer CL1 of the SOI layer by removing a portion of the conductor layer CL1 through etching. Thereby, the movable electrode VEL1 of the movable portion VU1 which is formed in the conductor layer CL1 and the movable electrode VEL2 of the movable portion VU2 which is formed in the conductor layer CL1 are isolated from each other by the isolation portion ISU1.

On the other hand, an isolation portion ISU2 and an isolation portion ISU3 are formed in the conductor layer CL2 of the SOI layer by removing a portion of the conductor layer CL2 through etching. Thereby, the movable electrode VEL2 of the movable portion VU1 which is formed in the conductor layer CL2 and the movable electrode VEL4 of the movable portion VU2 which is formed in the conductor layer CL2 are isolated from each other by the isolation portion ISU2 and the isolation portion ISU3. The mechanical coupling portion MCU which is formed in the conductor layer CL2 so as to be interposed between the isolation portion ISU2 and the isolation portion ISU3 is formed in the conductor layer CL2 of the SOI layer. Thereby, the movable portion VU1 and the movable portion VU2 which are formed in the SOI layer are electrically isolated from each other by the isolation portion ISU1, the isolation portion ISU2, and the isolation portion ISU3, and are mechanically connected to each other by the mechanical coupling portion MCU. In this case, as shown in FIG. 4, when seen in a cross-sectional view, the isolation portion ISU1 is formed on the mechanical coupling portion MCU, and the mechanical coupling portion MCU includes the isolation portion ISU1 therein. In addition, the mechanical coupling portion MCU is provided so as to be interposed between the isolation portion ISU2 and the isolation portion ISU3. The mechanical coupling portion MCU mechanically connects the movable portion VU1 and the movable portion VU2 which are isolated from each other in an x-direction perpendicular to a z-direction.

Subsequently, as shown in FIG. 4, the sensor element SE in Embodiment 1 has a fixed portion FU formed therein which is constituted by a cap portion and a base portion so as to surround the SOI layer in which the movable portion VU1, the movable portion VU2, and the mechanical coupling portion MCU are formed with a space interposed therebetween. A fixed electrode FEL1, a fixed electrode FEL2, a fixed electrode FEL3, and a fixed electrode FEL4 are formed in this fixed portion. Specifically, as shown in FIG. 4, the fixed electrode FEL1 is disposed at the cap portion of the fixed portion FU so as to be opposite to the movable electrode VEL1 of the movable portion VU1, and the fixed electrode FEL2 is disposed at the base portion of the fixed portion FU so as to be opposite to the movable electrode VEL2 of the movable portion VU1. Similarly, the fixed electrode FEL3 is disposed at the cap portion of the fixed portion FU so as to be opposite to the movable electrode VEL3 of the movable portion VU2, and the fixed electrode FEL4 is disposed at the base portion of the fixed portion FU so as to be opposite to the movable electrode VEL4 of the movable portion VU2. Thereby, in the sensor element SE in Embodiment 1, the variable capacitive element VCAP1 is formed by the movable portion VU1 and the fixed electrode FEL1, and the variable capacitive element VCAP2 is formed by the movable portion VU1 and the fixed electrode FEL2. Similarly, the variable capacitive element VCAP3 is formed by the movable portion VU2 and the fixed electrode FEL3, and the variable capacitive element VCAP4 is formed by the movable portion VU2 and the fixed electrode FEL4.

Here, in the sensor element SE in Embodiment 1, when the mass body MS is displaced in the z-direction, the capacitance of one variable capacitive element out of the variable capacitive element VCAP1 and the variable capacitive element VCAP2 increases, whereas the capacitance of the other variable capacitive element decreases. Similarly, the capacitance of one variable capacitive element of the variable capacitive element VCAP3 and the variable capacitive element VCAP4 increases, whereas the capacitance of the other variable capacitive element decreases.

For example, in FIG. 4, when the mass body MS is displaced in a +z-direction, an inter-electrode distance between the movable electrode VEL1 and the fixed electrode FEL1 which constitute the variable capacitive element VCAP1 becomes smaller, and thus the capacitance of the variable capacitive element VCAP1 increases. On the other hand, an inter-electrode distance between the movable electrode VEL2 and the fixed electrode FEL2 which constitute the variable capacitive element VCAP2 becomes larger, and thus the capacitance of the variable capacitive element VCAP2 decreases. Similarly, in FIG. 4, when the mass body MS is displaced in the +z-direction, an inter-electrode distance between the movable electrode VEL3 and the fixed electrode FEL3 which constitute the variable capacitive element VCAP3 becomes smaller, and thus the capacitance of the variable capacitive element VCAP3 increases. On the other hand, an inter-electrode distance between the movable electrode VEL4 and the fixed electrode FEL4 which constitute the variable capacitive element VCAP4 becomes larger, and thus the capacitance of the variable capacitive element VCAP4 decreases. In this manner, in the sensor element SE in Embodiment 1, the mass body MS is formed which includes the movable portion VU1 and the movable portion VU2 which are electrically isolated from each other and mechanically coupled to each other by processing the same SOI layer.

Meanwhile, as can be seen from FIGS. 2 and 4, the fixed electrode FEL1 and the fixed electrode FEL4 shown in FIG. 4 are electrically connected to each other, and are connected to the input terminal IN1 shown in FIG. 2. On the other hand, the fixed electrode FEL2 and the fixed electrode FEL3 shown in FIG. 4 are electrically connected to each other, and are connected to the input terminal IN2 shown in FIG. 2. As a result, from FIGS. 2 and 4, voltage signals having opposite phases to each other are input to the fixed electrode FEL1 which is connected to the input terminal IN1 and the fixed electrode FEL2 which is connected to the input terminal IN2. Similarly, voltage signals having opposite phases to each other are input to the fixed electrode FEL4 which is connected to the input terminal IN1 and the fixed electrode FEL3 which is connected to the input terminal IN2. Further, although not shown in FIG. 4, the movable portion VU1 is electrically connected to a first output portion (intermediate node A of FIG. 2), and the movable portion VU2 is electrically connected to a second output portion (intermediate node B of FIG. 2). In FIG. 2, the first output portion is connected to the inverting input terminal of the charge amplifier CAMP1 in the CV conversion unit 10, and the second output portion is connected to the inverting input terminal of the charge amplifier CAMP2 in the CV conversion unit 10.

In this manner, the sensor element SE in Embodiment 1 is configured. Hereinafter, features of the sensor element SE in Embodiment 1 which is configured in this manner will be described.

<Feature of Sensor Element in Embodiment 1>

A first feature of the sensor element SE in Embodiment 1 is in that the sensor element is formed by processing the same SOI layer on the assumption that the movable portion VU1 and the movable portion VU2 which constitute the mass body MS are formed using a manufacturing technique of a MEMS structure. Thereby, first, both the movable portion VU1 and the movable portion VU2 are formed as a MEMS structure by the assumption, and thus it is possible to reduce a manufacturing variation (processing accuracy) between the movable portion VU1 and the movable portion VU2. Further, in the sensor element SE in Embodiment 1, the movable portion VU1 and the movable portion VU2 are formed by processing the same SOI layer. Therefore, a manufacturing variation between the movable portion VU1 and the movable portion VU2 can be made much smaller than in a case where the movable portion VU1 and the movable portion VU2 are formed by processing separate layers. This point is the first feature of the sensor element SE in Embodiment 1. According to Embodiment 1, the manufacturing variation between the movable portion VU1 and the movable portion VU2 can be reduced by a synergistic effect between the above-mentioned assumption and the first feature. As a result, according to Embodiment 1, it is possible to suppress, for example, a shift ("discrepancy") between the capacitance of the MEMS capacitor 1 and the capacitance of the MEMS capacitor 2 shown in FIG. 2.

Subsequently, a second feature of the sensor element SE in Embodiment 1 is in that, on the assumption of the first feature of forming the movable portion VU1 and the movable portion VU2 in the same SOI layer, the movable portion VU1 and the movable portion VU2 are mechanically connected to each other by the mechanical coupling portion MCU even while these movable portions are electrically isolated from each other. Thereby, according to the sensor element SE in Embodiment 1, it is possible to further suppress a shift ("discrepancy") between the capacitance of the MEMS capacitor 1 and the capacitance of the MEMS capacitor 2 shown in FIG. 2.

For example, as shown in FIG. 4, when the movable portion VU1 and the movable portion VU2 are connected to each other by the mechanical coupling portion MCU, the movable portion VU1 and the movable portion VU2 are mechanically formed integrally with each other even while these movable portions are electrically isolated from each other. This means that, in FIG. 4, the movable portion VU1 and the movable portion VU2 are formed so that an inter-electrode distance between the movable electrode VEL1 of the movable portion VU1 and the fixed electrode FEL1, and an inter-electrode distance between the movable electrode VEL2 of the movable portion VU2 and the fixed electrode FEL2 are substantially equal to each other. In other words, this also means that, in FIG. 4, the movable portion VU1 and the movable portion VU2 are formed so that an inter-electrode distance between the movable electrode VEL2 of the movable portion VU1 and the fixed electrode FEL2, and an inter-electrode distance between the movable electrode VEL3 of the movable portion VU2 and the fixed electrode FEL3 are substantially equal to each other.

From this, according to the sensor element SE in Embodiment 1, it is possible to make the capacitance of the variable capacitive element VCAP1 and the capacitance of the variable capacitive element VCAP3 substantially equal to each other, and to make the capacitance of the variable capacitive element VCAP2 and the capacitance of the variable capacitive element VCAP4 substantially equal to each other. Thereby, according to Embodiment 1, for example, a shift ("discrepancy") between the capacitance of the MEMS capacitor 1 and the capacitance of the MEMS capacitor 2 shown in FIG. 2 can be considerably suppressed by a synergistic effect between the above-mentioned assumption, the first feature, and the second feature.

From the above, according to Embodiment 1, there are a contrivance point (see FIG. 2) on a circuit configuration in which two sets of MEMS capacitors (MEMS capacitor 1 and MEMS capacitor 2) are provided between the input terminal IN1 and the input terminal IN2, and a contrivance point (see FIG. 4) on a device structure in which the movable portion VU1 and the movable portion VU2 which are formed in the same SOI layer are mechanically coupled to each other while these movable portions are electrically isolated from each other by the mechanical coupling portion MCU. As a result, according to Embodiment 1, a high-sensitivity acceleration sensor having a high S/N ratio can be realized by a synergistic effect between the contrivance point on a circuit configuration and the contrivance point on a device structure.

Modification Example

Figure 5:
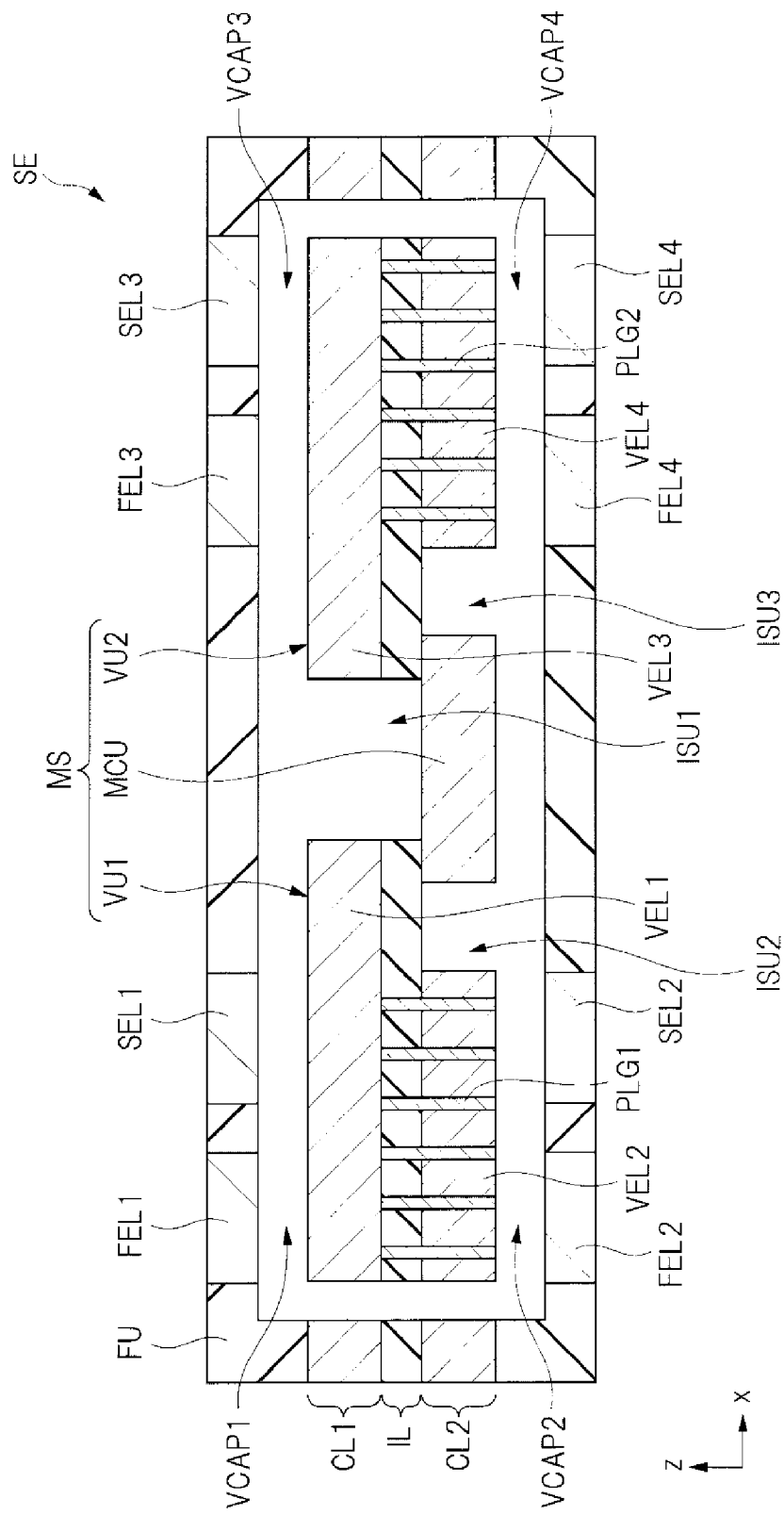
FIG. 5 is a cross-sectional view illustrating a modification example of the sensor element in Embodiment 1.

FIG. 5 is a cross-sectional view illustrating a modification example of the sensor element SE in Embodiment 1. In FIG. 5, in the sensor element SE in the present modification example, the fixed portion FU is provided with servo electrodes SEL1 to SEL4.

Specifically, the servo electrode SEL1 is provided at a position next to the fixed electrode FEL1 with an insulating layer interposed therebetween, that is, a position opposite to the movable electrode VEL1, and the servo electrode SEL2 is provided at a position next to the fixed electrode FEL2 with an insulating layer interposed therebetween, that is, a position opposite to the movable electrode VEL2. The servo electrode SEL1 and the servo electrode SEL2 have a function of applying a servo voltage for generating an electrostatic force by which the displacement of the movable portion VU1 is canceled.

In addition, the servo electrode SEL3 is provided at a position next to the fixed electrode FEL3 with an insulating layer interposed therebetween, that is, a position opposite to the movable electrode VEL3, and the servo electrode SEL4 is provided at a position next to the fixed electrode FEL4 with an insulating layer interposed therebetween, that is, a position opposite to the movable electrode VEL4. The servo electrode SEL3 and the servo electrode SEL4 have a function of applying a servo voltage for generating an electrostatic force by which the displacement of the movable portion VU2 is canceled.

The sensor element SE in the present modification example which is configured in this manner is formed from, for example, a capacitive element which is constituted by the movable portion VU1 and the servo electrode SEL1, and is configured to cancel the displacement of the movable portion VU1 based on acceleration in a z-direction due to a Coulomb's force (electrostatic force) which is generated by applying a servo voltage to this capacitive element. Thereby, even when acceleration is applied to the sensor element SE, the movable portion VU1 is scarcely displaced in the z-direction, but a servo voltage proportional to the magnitude of the acceleration is applied to the servo electrode SEL1. Therefore, this servo voltage is output, thereby allowing the acceleration applied to the sensor element SE to be detected accordingly.

The advantage of providing the servo electrodes SEL1 to SEL4 lies in the capability of detecting acceleration without displacing the movable portion VU1 and the movable portion VU2 in the z-direction. That is, when large acceleration is applied to the sensor element SE by providing a servo mechanism, the movable portion VU1 and movable portion VU2, and the fixed electrode can be prevented from coming into contact with each other by the unexpected displacement of the movable portion VU1 and the movable portion VU2.

Particularly, in the sensor element SE in the present modification example shown in FIG. 5, the fixed electrodes FEL1 to FEL4 and the servo electrodes SEL1 to SEL4 are provided as separate components, and thus it is possible to simultaneously perform an operation for detecting acceleration and a servo operation for canceling displacement.

However, the configuration of the servo mechanism is not limited to the configuration shown in FIG. 5, and can also be configured to cause the fixed electrodes FEL1 to FEL4 to function as the servo electrodes SEL1 to SEL4, for example, in FIG. 4. That is, in FIG. 4, the fixed electrodes FEL1 to FEL4 and the servo electrodes SEL1 to SEL4 can also be configured to be shared. In this case, the operation for detecting acceleration and the servo operation for canceling displacement are brought into function by time division.

Meanwhile, in the present modification example, "a first servo electrode that applies a first servo voltage for generating an electrostatic force by which the displacement of the movable portion VU1 is canceled" may be included in order to realize a servo operation. Here, "a second servo electrode that applies a second servo voltage for generating an electrostatic force by which the displacement of the movable portion VU2 is canceled" may be further included. In this case, since the movable portion VU1 and the movable portion VU2 are formed integrally with each other by the mechanical coupling portion MCU and are displaced similarly, the value of the first servo voltage and the absolute value of the second servo voltage are the same as each other.

Embodiment 2 (Seesaw Structure)

Figure 6:
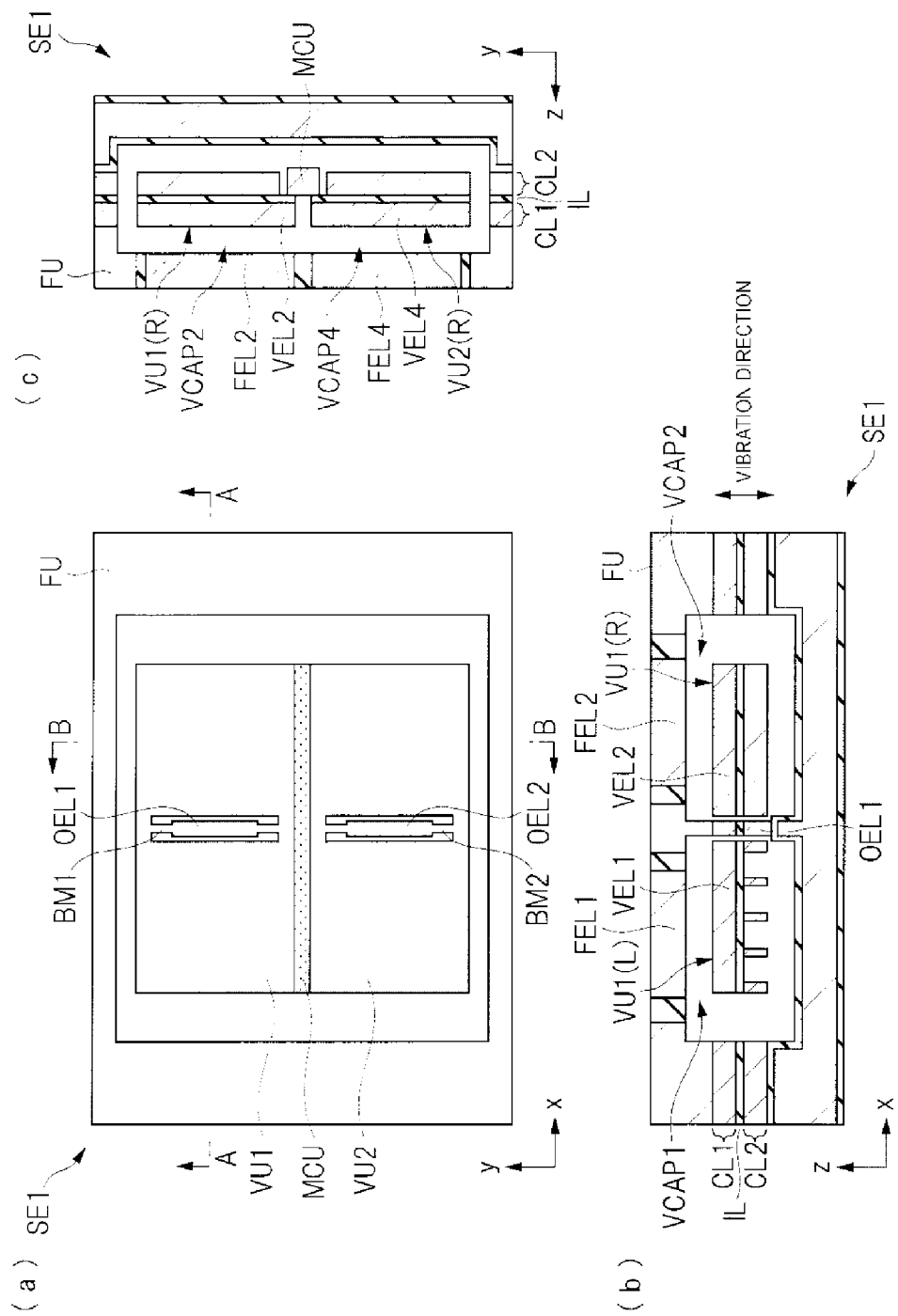
FIG. 6(a) is a plan view illustrating a device structure of a sensor element in Embodiment 2.
FIG. 6(b) is a cross-sectional view taken along line A-A of FIG. 6(a)
FIG. 6(c) is a cross-sectional view taken along line B-B of FIG. 6(a).

Next, a device structure of a sensor element SE1 in Embodiment 2 will be described. FIG. 6 is a diagram illustrating a device structure of a sensor element SE1 in Embodiment 2. Particularly, FIG. 6(a) is a plan view illustrating a device structure of the sensor element SE1 in Embodiment 2, FIG. 6(b) is a cross-sectional view taken along line A-A of FIG. 6(a), and FIG. 6(c) is a cross-sectional view taken along line B-B of FIG. 6(a).

First, as shown in FIG. 6(a), the sensor element SE1 in Embodiment 2 includes a fixed portion FU that surrounds an enclosed space, and is configured such that a rectangular movable portion VU1 and a rectangular movable portion VU2 are provided inside this fixed portion FU. The movable portion VU1 and the movable portion VU2 are mechanically connected to each other by a mechanical coupling portion MCU while these movable portions are electrically isolated from each other.

In FIG. 6(a), the movable portion VU1 is connected to an output portion (output electrode) OEL1 through a beam BM1, and the movable portion VU2 is connected to an output portion (output electrode) OEL2 through a beam BM2. Specifically, as shown in FIG. 6(a), when seen in a plan view, the output portion OEL1 is disposed at the central portion of the movable portion VU1, and the mass of the movable portion VU1 on the left side and the mass of the movable portion VU1 on the right side are configured to be different from each other. Similarly, when seen in a plan view, the output portion OEL2 is disposed at the central portion of the movable portion VU2, and the mass of the movable portion VU2 on the left side and the mass of the movable portion VU2 on the right side are configured to be different from each other.

As shown in FIG. 6(b), the movable portion VU1 (see FIG. 6(a)) is constituted by a movable portion VU1(L) disposed on the left side and a movable portion VU1(R) disposed on the right side, centering on the output portion OEL1. In this case, the movable portion VU1(R) and the movable portion VU1(L) are formed in an SOI layer which is constituted by an insulating layer IL, a conductor layer CL1, and a conductor layer CL2. Both the movable portion VU1(R) and the movable portion VU1(L) are also formed by processing the conductor layer CL1 and the conductor layer CL2, but as shown in FIG. 6(b), an etching process is performed on the conductor layer CL2 of the movable portion VU1(L). As a result, the mass of the movable portion VU1(R) and the mass of the movable portion VU1(L) are different from each other. Specifically, the mass of the movable portion VU1(L) is lighter in weight by the amount of the conductor layer CL2 etched than the mass of the movable portion VU1(R). In this manner, in the sensor element SE1 in Embodiment 2, it is possible to realize the sensor element SE1 having a "seesaw structure" in which the masses of the movable portion VU1(R) and the movable portion VU1(L) which are disposed on the right and left sides centering on the output portion OEL1 disposed at the central portion are different from each other. A fixed electrode FEL1 is disposed so as to be opposite to the movable portion VU1(L), and a fixed electrode FEL2 is disposed so as to be opposite to the movable portion VU1(R). Thereby, a capacitive element VCAP1 is formed by the movable electrode VEL1 of the movable portion VU1(L) and the fixed electrode FEL1, and a capacitive element VCAP2 is formed by the movable electrode VEL2 of the movable portion VU1(R) and the fixed electrode FEL2.

Meanwhile, as shown in FIG. 6(c), it can also be understood that, in the sensor element SE1 in Embodiment 2, the movable portion VU1(R) and the movable portion VU2(R) are also mechanically connected to each other by the mechanical coupling portion MCU while these movable portions are electrically isolated from each other. In this manner, the sensor element SE1 in Embodiment 2 is formed.

The sensor element SE1 in Embodiment 2 is configured such that, when acceleration is applied in a z-direction, the mass body is displaced in the z-direction. For example, in FIG. 6(b), when acceleration vibrating in a −z-direction and a +z-direction is applied, the movable portion VU1(L) and the movable portion VU1(R) operate in a seesaw manner. For example, when an inter-electrode distance between the movable electrode VEL1 of the movable portion VU1(L) and the fixed electrode FEL1 becomes smaller due to this seesaw operation, an inter-electrode distance between the movable electrode VEL2 of the movable electrode VU1(R) and the fixed electrode FEL2 becomes larger. On the other hand, for example, when an inter-electrode distance between the movable electrode VEL1 of the movable portion VU1(L) and the fixed electrode FEL1 becomes larger, an inter-electrode distance between the movable electrode VEL2 of the movable electrode VU1(R) and the fixed electrode FEL2 becomes smaller. As a result, according to the sensor element SE1 in Embodiment 2, a change in the capacitance of the variable capacitive element VCAP1 and a change in the capacitance of the variable capacitive element VCAP2 can be made to have inverse characteristics to each other. Therefore, a MEMS structure including the MEMS capacitor 1 and the MEMS capacitor 2 shown in FIG. 2 can be realized by the sensor element SE1 in Embodiment 2.

An advantage specific to the sensor element SE1 in Embodiment 2 includes a point that the fixed electrode FEL1 (FEL3) and the fixed electrode FEL2 (FEL4) may be provided on only the cap portion side of the fixed portion FU, and a point that a plug may not be provided in the SOI layer. Thereby, the structure of the sensor element SE1 in Embodiment 2 is simplified, and thus it is possible to obtain the advantage of facilitating the manufacture of the sensor element SE1.

Modification Example

Figure 7:
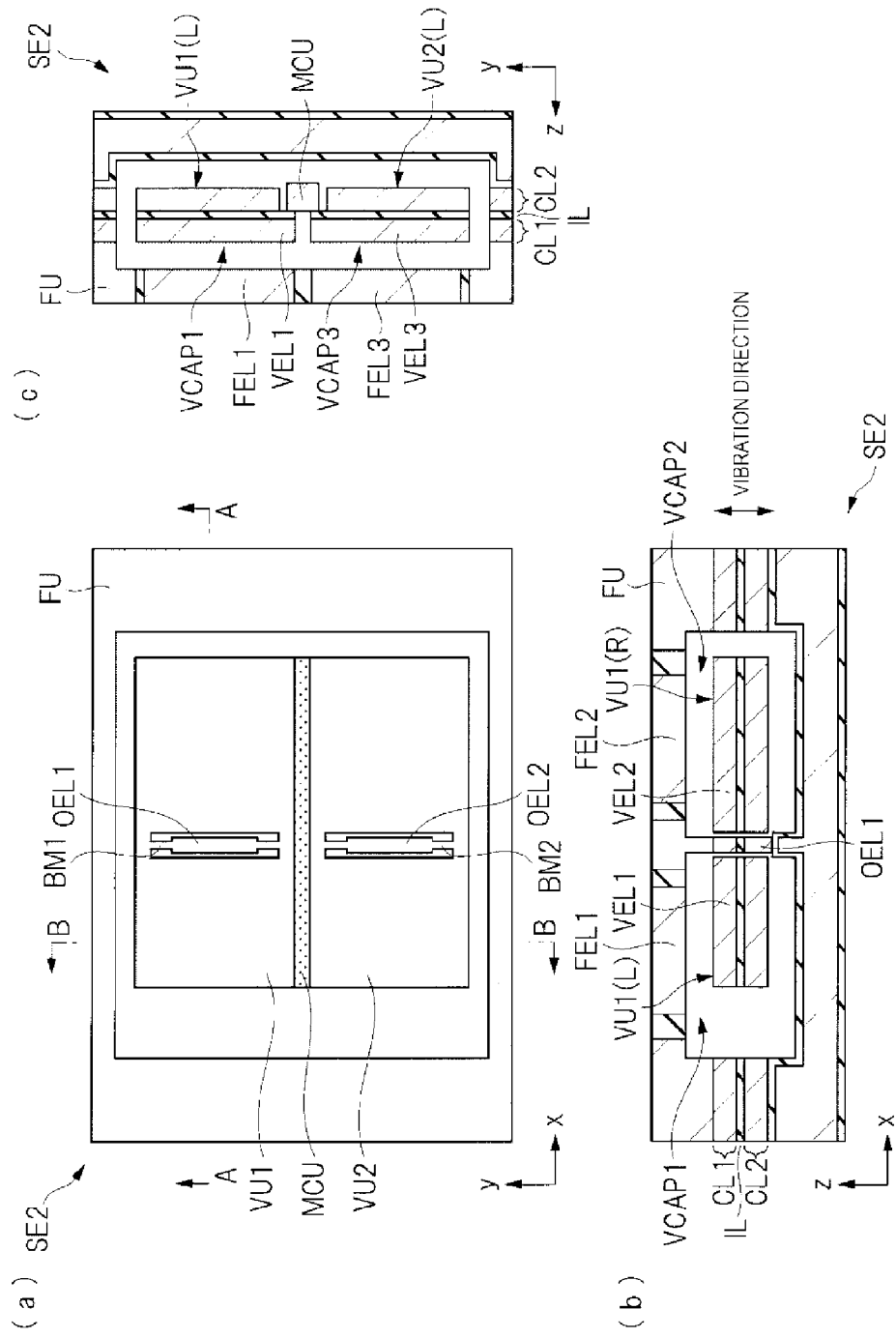
FIG. 7(a) is a plan view illustrating a device structure of a sensor element in a modification example.
FIG. 7(b) is a cross-sectional view taken along line A-A of FIG. 7(a)
FIG. 7(c) is a cross-sectional view taken along line B-B of FIG. 7(a).

Subsequently, a modification example of Embodiment 2 will be described. FIG. 7 is a diagram illustrating a device structure of a sensor element SE2 in the present modification example.

Particularly, FIG. 7(a) is a plan view illustrating a device structure of the sensor element SE2 in the present modification example, FIG. 7(b) is a cross-sectional view taken along line A-A of FIG. 7(a), and FIG. 7(c) is a cross-sectional view taken along line B-B of FIG. 7(a).

As shown in FIGS. 7(a) to 7(c), in the sensor element SE2 in the present modification example, when seen in a plan view, the output portion OEL1 is disposed at a position shifted from the central portion of the movable portion VU1, and thus the mass of the movable portion VU1(L) present on the left side with respect to the output portion OEL1 and the mass of the movable portion VU1(R) present on the right side with respect to the output portion OEL1 are configured to be different from each other. Similarly, in the sensor element SE2 in the present modification example, when seen in a plan view, the output portion OEL2 is disposed at a position shifted from the central portion of the movable portion VU2, and thus the mass of the movable portion VU2(L) present on the left side with respect to the output portion OEL2 and the mass of the movable portion present on the right side with respect to the output portion OEL2 are configured to be different from each other.

Thereby, in the sensor element SE2 in the present modification example, when acceleration vibrating in a −z-direction and a +z-direction is applied, the movable portion VU1(L) and the movable portion VU1(R) also operate in a seesaw manner. As a result, according to the sensor element SE2 in the present modification example, a change in the capacitance of the variable capacitive element VCAP1 and a change in the capacitance of the variable capacitive element VCAP2 can be made to have inverse characteristics to each other. Therefore, a MEMS structure including the MEMS capacitor 1 and the MEMS capacitor 2 shown in FIG. 2 can also be realized by the sensor element SE1 in the present modification example.

Embodiment 3 (Clamped-Free Structure)

Figure 8:
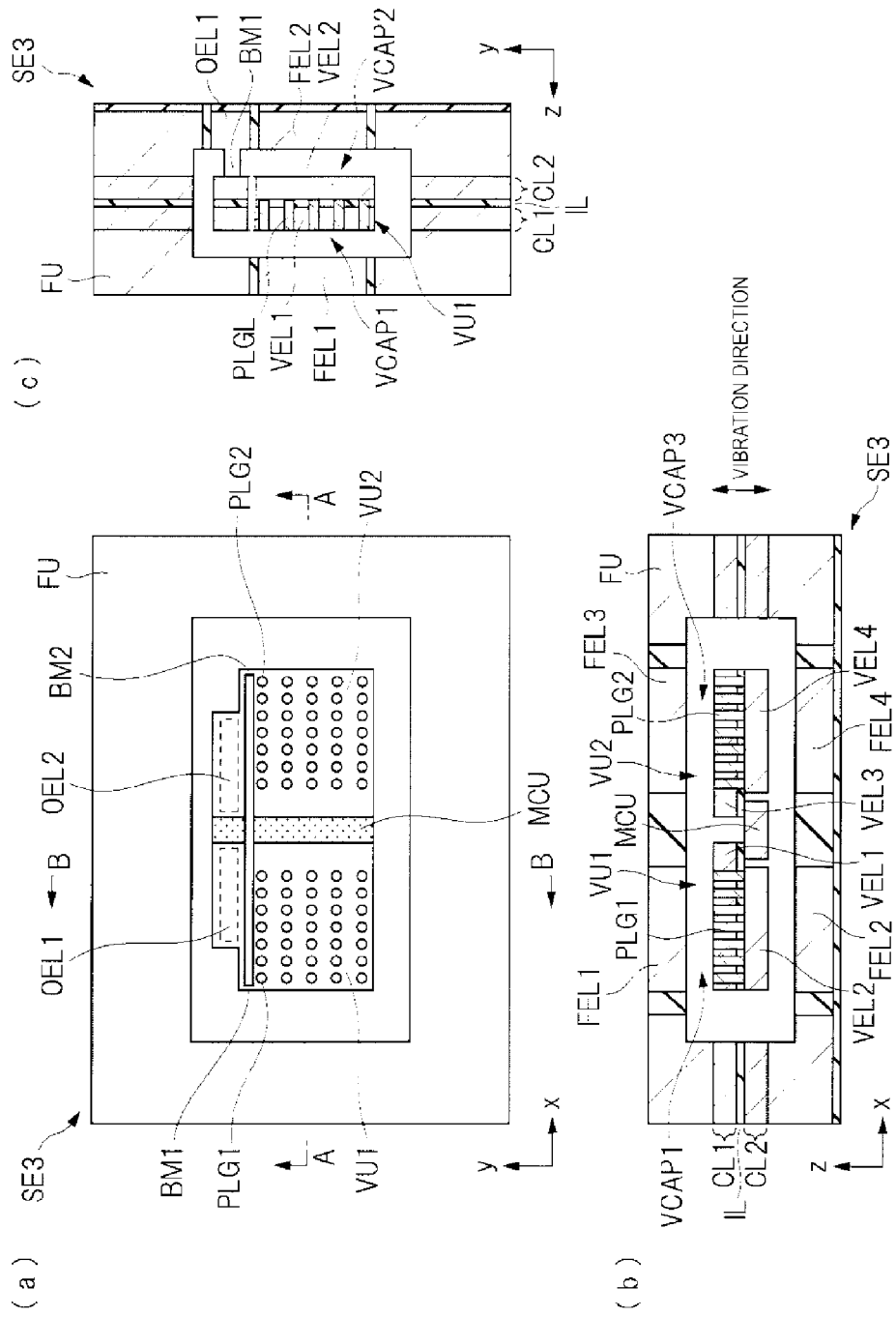
FIG. 8(a) is a plan view illustrating a device structure of a sensor element in Embodiment 3.
FIG. 8(b) is a cross-sectional view taken along line A-A of FIG. 8(a)
FIG. 8(c) is a cross-sectional view taken along line B-B of FIG. 8(a).

Next, a device structure of a sensor element SE3 in Embodiment 3 will be described. FIG. 8 is a diagram illustrating a device structure of a sensor element SE3 in Embodiment 3. Particularly, FIG. 8(a) is a plan view illustrating a device structure of the sensor element SE3 in Embodiment 3, FIG. 8(b) is a cross-sectional view taken along line A-A of FIG. 8(a), and FIG. 8(c) is a cross-sectional view taken along line B-B of FIG. 8(a).

First, as shown in FIG. 8(a), the sensor element SE3 in Embodiment 3 includes a fixed portion FU that surrounds an enclosed space, and is configured such that a rectangular movable portion VU1 and a rectangular movable portion VU2 are provided inside this fixed portion FU. The movable portion VU1 and the movable portion VU2 are mechanically connected to each other by a mechanical coupling portion MCU while these movable portions are electrically isolated from each other.

In FIG. 8(a), the movable portion VU1 is connected to the output portion (output electrode) OEL1 through the beam BM1, and the movable portion VU2 is connected to the output portion (output electrode) OEL2 through the beam BM2. Specifically, as shown in FIG. 8(c), the beam BM1 is a clamped-free beam which is connected to the end of the movable portion VU1. Similarly, the beam BM2 (see FIG. 8(a)) is a clamped-free beam which is connected to the end of the movable portion VU2. From this, in the sensor element SE3 in Embodiment 3, a "clamped-free structure" is realized in which the end of the movable portion VU1 is supported by the beam BM1 which is a clamped-free beam, and the end of the movable portion VU2 is supported by the beam BM2 which is a clamped-free beam.

Meanwhile, a structure shown in FIG. 8(b) has the same configuration as that in FIG. 4 described in Embodiment 1, except that the structure is formed so that the plug PLG1 reaches the conductor layer CL2 from the conductor layer CL1 of the movable portion VU1 through the insulating layer IL, and that the plug PLG2 reaches the conductor layer CL2 from the conductor layer CL1 of the movable portion VU2 through the insulating layer IL, and thus the description of FIG. 8(b) will not be given.

In the sensor element SE3 in Embodiment 3 which is configured in this manner, the "clamped-free structure" is realized, and the mass body is displaced in a z-direction when acceleration is applied in the z-direction. For example, in FIG. 8(c), when acceleration vibrating in a −z-direction and a +z-direction is applied, the movable portion VU1 supported by the beam BM1 which is a clamped-free beam vibrates in the z-direction. Thereby, for example, when an inter-electrode distance between the movable electrode VEL1 of the movable portion VU1 and the fixed electrode FEL1 becomes smaller, an inter-electrode distance between the movable electrode VEL2 of the movable electrode VU1 and the fixed electrode FEL2 becomes larger. On the other hand, for example, when an inter-electrode distance between the movable electrode VEL1 of the movable portion VU1 and the fixed electrode FEL1 becomes larger, an inter-electrode distance between the movable electrode VEL2 of the movable electrode VU1 and the fixed electrode FEL2 becomes smaller. As a result, according to the sensor element SE3 in Embodiment 3, a change in the capacitance of the variable capacitive element VCAP1 and a change in the capacitance of the variable capacitive element VCAP2 can be made to have inverse characteristics to each other. Therefore, a MEMS structure including the MEMS capacitor 1 and the MEMS capacitor 2 shown in FIG. 2 can be realized by the sensor element SE3 in Embodiment 3.

As described above, as an example of a so-called "out-of-plane detection structure" in which a change in the capacitance of a capacitive element occurs with a change in a movable portion in a z-direction as acceleration is applied in the z-direction, the "seesaw structure" has been described in Embodiment 2, and the "clamped-free structure" has been described in Embodiment 3. A sensor element having such an "out-of-plane detection structure" uses the occurrence of a change in the capacitance of the capacitive element due to a change in an inter-electrode distance between the movable portion and the fixed electrode which is caused by the displacement of the movable portion in the z-direction.

In Embodiment 4 shown below, a description will be given of an example of a so-called "in-plane detection structure" in which a change in the capacitance of a capacitive element occurs with a change in a movable portion in an x-direction as acceleration is applied in the x-direction. A sensor element having such a "in-plane detection structure" includes a configuration in which the occurrence of a change in the capacitance of the capacitive element due to a change in an inter-electrode distance between the movable portion and the fixed electrode which is caused by the displacement of the movable portion in the x-direction is used, and a configuration in which the occurrence of a change in the capacitance of the capacitive element due to a change in an inter-electrode opposite area between the movable portion and the fixed electrode which is caused by the displacement of the movable portion in the x-direction is used. Consequently, in Embodiment 4 described below, device structures having respective configurations will be described.

Embodiment 4 (In-Plane Detection Structure)

Figure 9:
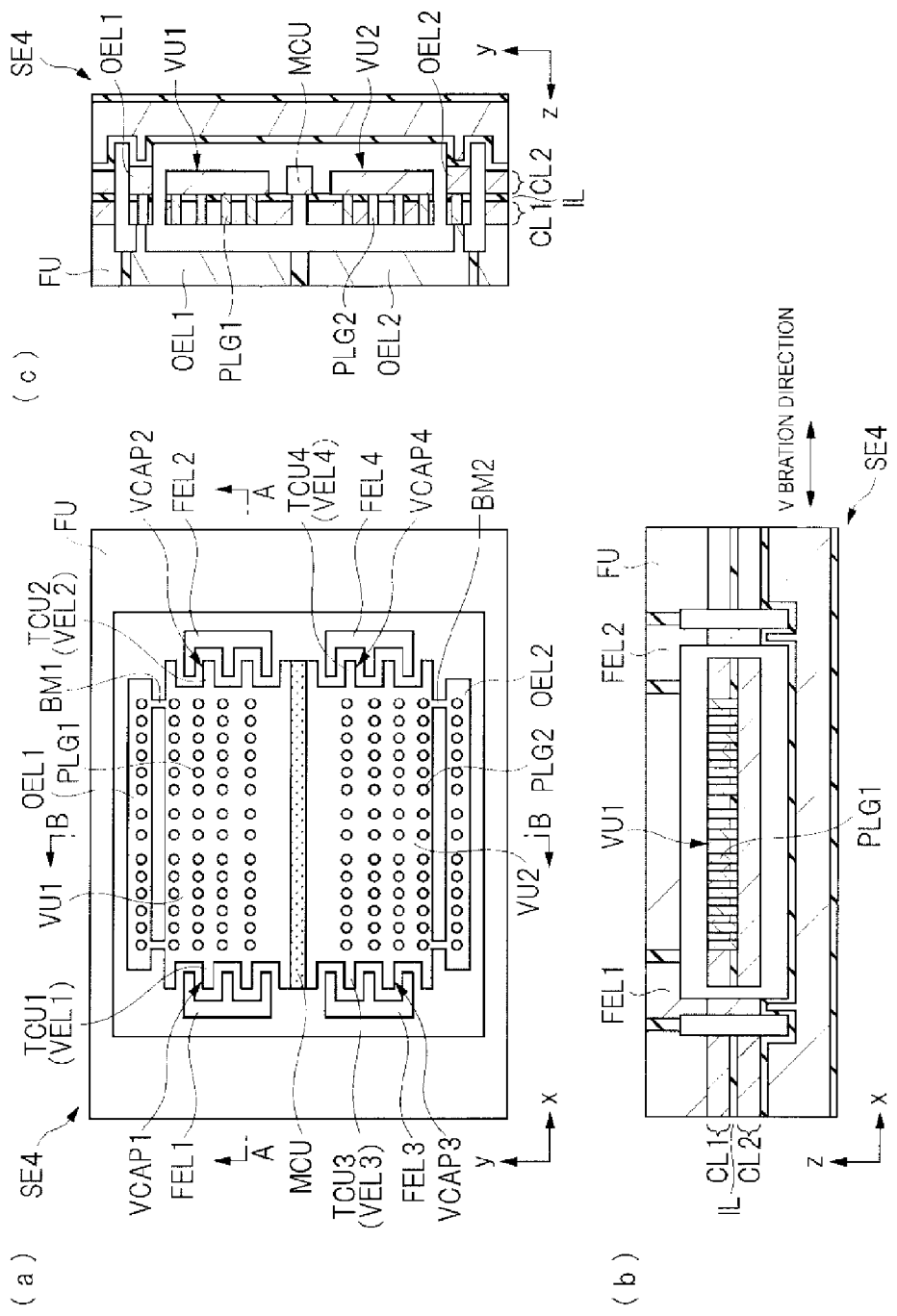
FIG. 9(a) is a plan view illustrating a device structure of a sensor element in Embodiment 4.
FIG. 9(b) is a cross-sectional view taken along line A-A of FIG. 9(a)
FIG. 9(c) is a cross-sectional view taken along line B-B of FIG. 9(a).

Subsequently, a device structure of a sensor element SE4 in Embodiment 4 will be described. FIG. 9 is a diagram illustrating a device structure of a sensor element SE4 in Embodiment 4. Particularly, FIG. 9(a) is a plan view illustrating a device structure of the sensor element SE4 in Embodiment 4, FIG. 9(b) is a cross-sectional view taken along line A-A of FIG. 9(a), and FIG. 9(c) is a cross-sectional view taken along line B-B of FIG. 9(a).

First, as shown in FIG. 9(a), the sensor element SE4 in Embodiment 4 includes a fixed portion FU that surrounds an enclosed space, and is configured such that a rectangular movable portion VU1 and a rectangular movable portion VU2 are provided inside this fixed portion FU in a y-direction. The movable portion VU1 and the movable portion VU2 are mechanically connected to each other by a mechanical coupling portion MCU while these movable portions are electrically isolated from each other.

In FIG. 9(a), an inter-digital transducer portion TCU1 and an inter-digital transducer portion TCU2 are formed in end regions of the movable portion VU1 on both sides in an x-direction, respectively. In this case, the inter-digital transducer portion TCU1 functions as a movable electrode VEL1, and the inter-digital transducer portion TCU2 functions as a movable electrode VEL2. A fixed electrode FEL1 having a comb-teeth shape is disposed so as to be opposite to the inter-digital transducer portion TCU1, and a variable capacitive element VCAP1 is formed by the inter-digital transducer portion TCU1 and the fixed electrode FEL1. Similarly, a fixed electrode FEL2 having a comb-teeth shape is disposed so as to be opposite to the inter-digital transducer portion TCU2, and a variable capacitive element VCAP2 is formed by the inter-digital transducer portion TCU2 and the fixed electrode FEL2.

Similarly, an inter-digital transducer portion TCU3 and an inter-digital transducer portion TCU4 are formed in end regions of the movable portion VU2 on both sides in the x-direction, respectively. In this case, the inter-digital transducer portion TCU3 functions as a movable electrode VEL3, and the inter-digital transducer portion TCU4 functions as a movable electrode VEL4. A fixed electrode FEL3 having a comb-teeth shape is disposed so as to be opposite to the inter-digital transducer portion TCU3, and a variable capacitive element VCAP3 is formed by the inter-digital transducer portion TCU3 and the fixed electrode FEL3. Similarly, a fixed electrode FEL4 having a comb-teeth shape is disposed so as to be opposite to the inter-digital transducer portion TCU4, and a variable capacitive element VCAP4 is formed by the inter-digital transducer portion TCU4 and the fixed electrode FEL4.

Further, in FIG. 9(a), the movable portion VU1 is connected to an output portion OEL1 by a beam BM1, and the movable portion VU2 is connected to an output portion OEL2 by a beam BM2.

Next, as shown in FIG. 9(b), for example, the movable portion VU1 is formed by processing an SOI layer which is constituted by an insulating layer IL, and a conductor layer CL1 and a conductor layer CL2 having the insulating layer IL interposed therebetween. In the movable portion VU1, a plurality of plugs PLG1 reaching the conductor layer CL2 from the conductor layer CL1 through the insulating layer IL are formed, and the conductor layer CL1 and the conductor layer CL2 are electrically connected to each other. Meanwhile, in FIG. 9(b), the cross-section structure of the movable portion VU2 is not shown, but the cross-section structure of the movable portion VU2 is also configured similarly to the cross-section structure of the movable portion VU1 shown in FIG. 9(b). Subsequently, as shown in FIG. 9(c), it can be understood that the movable portion VU1 and the movable portion VU2 are mechanically connected to each other by a mechanical coupling portion MCU which is formed by processing the conductor layer CL2.

In the sensor element SE4 in Embodiment 4 which is configured in this manner, an "in-plane detection structure" is realized, and the mass body is displaced in an x-direction when acceleration is applied in the x-direction. For example, in FIG. 9(a), when acceleration is applied in a +x-direction, the movable portion VU1 which is supported by the beam BM1 is displaced in the +x-direction. Thereby, for example, an inter-electrode opposite area between the inter-digital transducer portion TCU1 (movable electrode VEL1) of the movable portion VU1 and the fixed electrode FEL1 having a comb-teeth shape decreases, whereas an inter-electrode opposite area between the inter-digital transducer portion TCU2 (movable electrode VEL2) of the movable electrode VU1 and the fixed electrode FEL2 increases. On the other hand, when acceleration is applied in a −x-direction, the movable portion VU1 which is supported by the beam BM1 is displaced in a −x-direction. Thereby, for example, an inter-electrode opposite area between the inter-digital transducer portion TCU1 (movable electrode VEL1) of the movable portion VU1 and the fixed electrode FEL1 having a comb-teeth shape increases, whereas an inter-electrode opposite area between the inter-digital transducer portion TCU2 (movable electrode VEL2) of the movable electrode VU1 and the fixed electrode FEL2 decreases. As a result, according to the sensor element SE4 in Embodiment 4, a change in the capacitance of the variable capacitive element VCAP1 and a change in the capacitance of the variable capacitive element VCAP2 can be made to have inverse characteristics to each other. Therefore, a MEMS structure including the MEMS capacitor 1 and the MEMS capacitor 2 shown in FIG. 2 can be realized by the sensor element SE4 in Embodiment 4.

Modification Example 1

Figure 10:
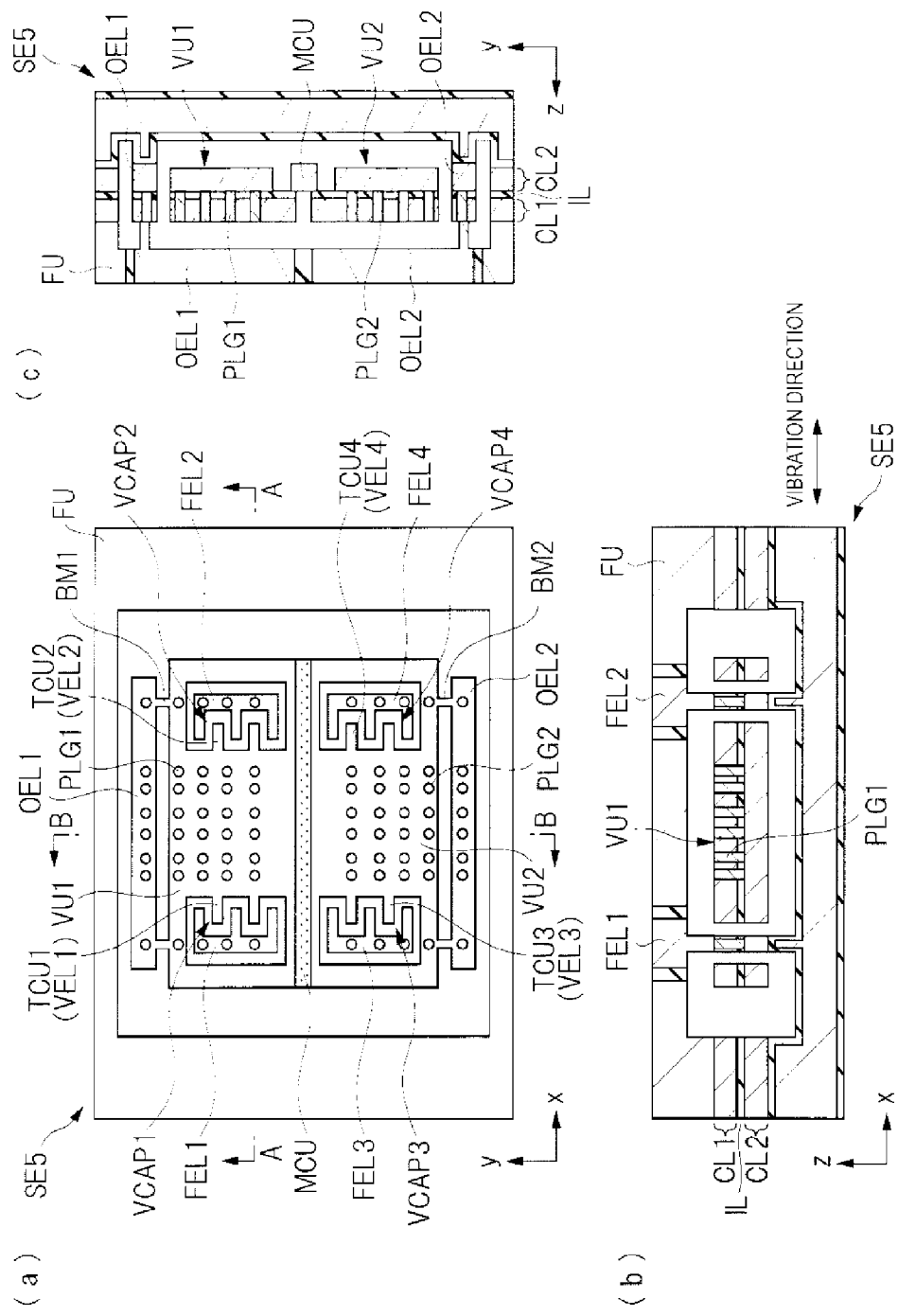
FIG. 10(a) is a plan view illustrating a device structure of a sensor element in Modification Example 1.
FIG. 10(b) is a cross-sectional view taken along line A-A of FIG. 10(a)
FIG. 10(c) is a cross-sectional view taken along line B-B of FIG. 10(a).

Next, Modification Example 1 of Embodiment 4 will be described. FIG. 10 is a diagram illustrating a device structure of a sensor element SE5 in Modification Example 1. Particularly, FIG. 10(a) is a plan view illustrating a device structure of the sensor element SE5 in Modification Example 1, FIG. 10(b) is a cross-sectional view taken along line A-A of FIG. 10(a), and FIG. 10(c) is a cross-sectional view taken along line B-B of FIG. 10(a).

As shown in FIG. 10(a), the sensor element SE5 in Modification Example 1 is configured such that two spaces are provided inside the movable body VU1, the inter-digital transducer portion TCU1 is formed so as to protrude toward one space side, and that the fixed electrode FEL1 is provided inside the one space so as to be opposite to the inter-digital transducer portion TCU1. In addition, the inter-digital transducer portion TCU2 is formed so as to protrude toward the other space side, and the fixed electrode FEL2 is provided inside the other space so as to be opposite to the inter-digital transducer portion TCU2. Similarly, two spaces are also provided inside the movable body VU2, the inter-digital transducer portion TCU3 is formed so as to protrude toward one space side, and the fixed electrode FEL3 is provided inside the one space so as to be opposite to the inter-digital transducer portion TCU3. In addition, the inter-digital transducer portion TCU4 is formed so as to protrude toward the other space side, and the fixed electrode FEL4 is provided inside the other space so as to be opposite to the inter-digital transducer portion TCU4.

In the sensor element SE5 in Modification Example 1 which is configured in this manner, it is also possible to realize a MEMS structure including the MEMS capacitor 1 and the MEMS capacitor 2 shown in FIG. 2.

Modification Example 2

Figure 11:
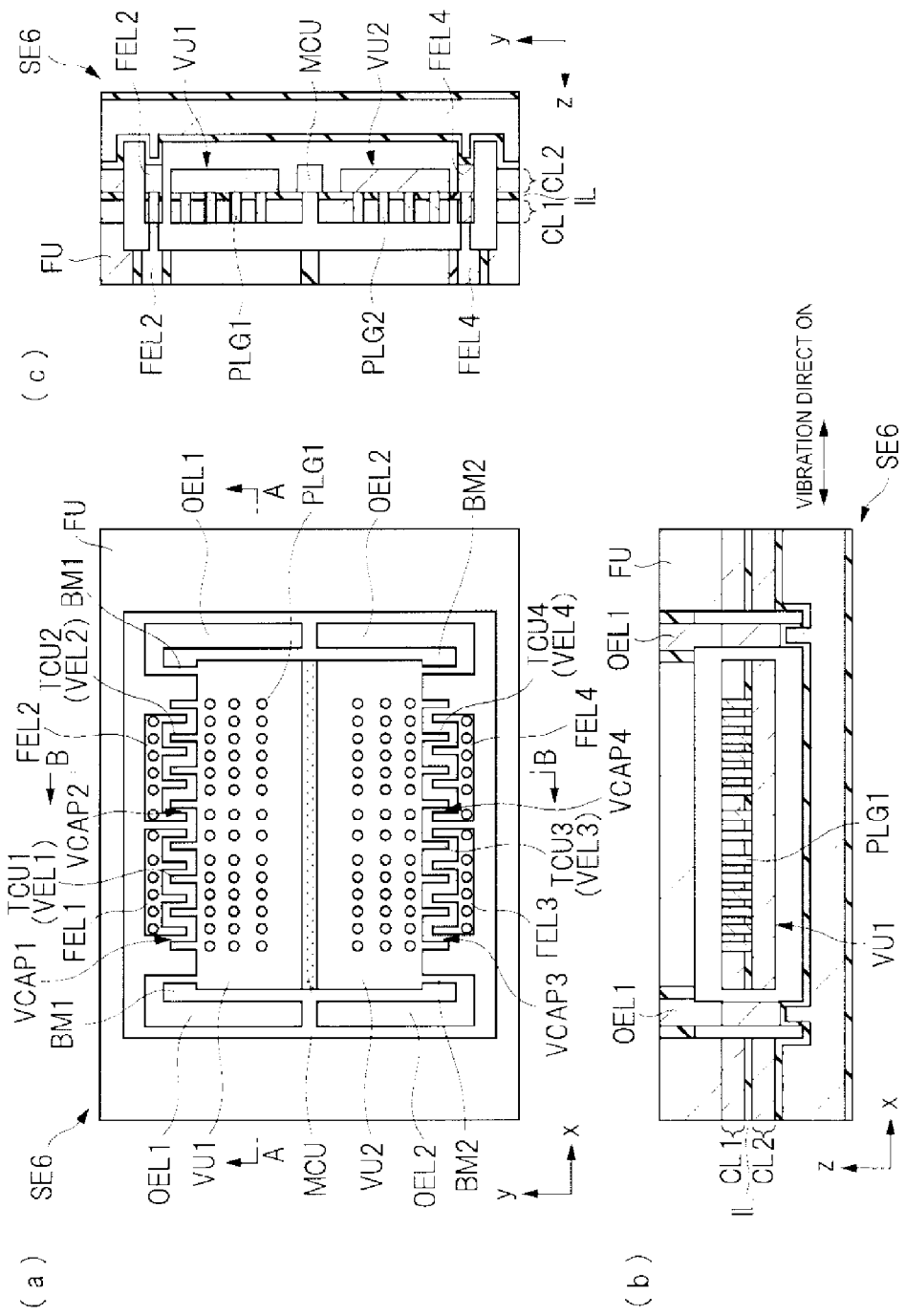
FIG. 11(a) is a plan view illustrating a device structure of a sensor element in Modification Example 2.
FIG. 11(b) is a cross-sectional view taken along line A-A of FIG. 11(a)
FIG. 11(c) is a cross-sectional view taken along line B-B of FIG. 11(a).

Subsequently, Modification Example 2 of Embodiment 4 will be described. FIG. 11 is a diagram illustrating a device structure of a sensor element SE6 in Modification Example 2. Particularly, FIG. 11(a) is a plan view illustrating a device structure of the sensor element SE6 in Modification Example 2, FIG. 11(b) is a cross-sectional view taken along line A-A of FIG. 11(a), and FIG. 11(c) is a cross-sectional view taken along line B-B of FIG. 11(a).

As shown in FIG. 11(a), in the sensor element SE6 in Modification Example 2, the movable portion VU1 and the movable portion VU2 are also mechanically connected to each other by the mechanical coupling portion MCU while these movable portions are electrically isolated from each other.

In FIG. 11(a), the inter-digital transducer portion TCU1 and the inter-digital transducer portion TCU2 are formed in end regions of the movable portion VU1 in the y-direction side. In this case, the inter-digital transducer portion TCU1 functions as the movable electrode VEL1, and the inter-digital transducer portion TCU2 functions as the movable electrode VEL2. The fixed electrode FEL1 having a comb-teeth shape is disposed so as to be opposite to the inter-digital transducer portion TCU1, and the variable capacitive element VCAP1 is formed by the inter-digital transducer portion TCU1 and the fixed electrode FEM. Similarly, the fixed electrode FEL2 having a comb-teeth shape is disposed so as to be opposite to the inter-digital transducer portion TCU2, and the variable capacitive element VCAP2 is formed by the inter-digital transducer portion TCU2 and the fixed electrode FEL2.

Similarly, the inter-digital transducer portion TCU3 and the inter-digital transducer portion TCU4 are formed in end regions of the movable portion VU2 in the -y-direction side. In this case, the inter-digital transducer portion TCU3 functions as the movable electrode VEL3, and the inter-digital transducer portion TCU4 functions as the movable electrode VEL4. The fixed electrode FEL3 having a comb-teeth shape is disposed so as to be opposite to the inter-digital transducer portion TCU3, and the variable capacitive element VCAP3 is formed by the inter-digital transducer portion TCU3 and the fixed electrode FEL3. Similarly, the fixed electrode FEL4 having a comb-teeth shape is disposed so as to be opposite to the inter-digital transducer portion TCU4, and the variable capacitive element VCAP4 is formed by the inter-digital transducer portion TCU4 and the fixed electrode FEL4.

Further, in FIG. 11(a), the movable portion VU1 is connected to the output portion OEL1 by the beam BM1, and the movable portion VU2 is connected to the output portion OEL2 by the beam BM2.

In the sensor element SE6 in Modification Example 2 which is configured in this manner, an "in-plane detection structure" is realized, and the mass body is displaced in an x-direction when acceleration is applied in the x-direction. For example, in FIG. 11(a), when acceleration is applied in a +x-direction, the movable portion VU1 which is supported by the beam BM1 is displaced in the +x-direction. Thereby, for example, an inter-electrode distance between the inter-digital transducer portion TCU1 (movable electrode VEL1) of the movable portion VU1 and the fixed electrode FEL1 having a comb-teeth shape becomes smaller, whereas an inter-electrode distance between the inter-digital transducer portion TCU2 (movable electrode VEL2) of the movable electrode VU1 and the fixed electrode FEL2 becomes larger. On the other hand, when acceleration is applied in a -x-direction, the movable portion VU1 which is supported by the beam BM1 is displaced in the -x-direction. Thereby, for example, an inter-electrode distance between the inter-digital transducer portion TCU1 (movable electrode VEL1) of the movable portion VU1 and the fixed electrode FEL1 having a comb-teeth shape becomes larger, whereas an inter-electrode distance between the inter-digital transducer portion TCU2 (movable electrode VEL2) of the movable electrode VU1 and the fixed electrode FEL2 becomes smaller. As a result, according to the sensor element SE6 in Modification Example 2, a change in the capacitance of the variable capacitive element VCAP1 and a change in the capacitance of the variable capacitive element VCAP2 can be made to have inverse characteristics to each other. Therefore, a MEMS structure including the MEMS capacitor 1 and the MEMS capacitor 2 shown in FIG. 2 can be realized by the sensor element SE6 in Modification Example 2.

Modification Example 3

Figure 12:
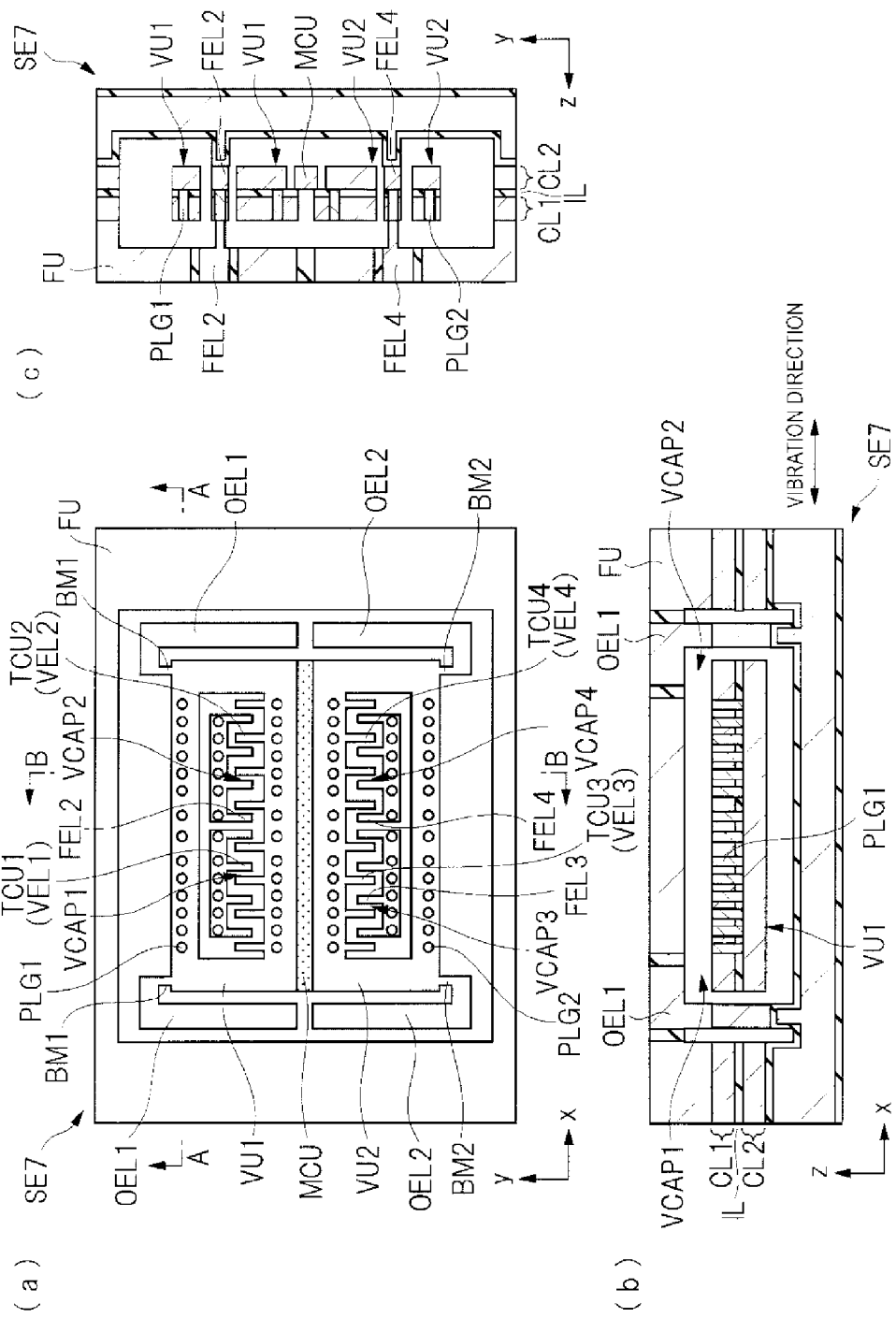
FIG. 12(a) is a plan view illustrating a device structure of a sensor element in Modification Example 3.
FIG. 12(b) is a cross-sectional view taken along line A-A of FIG. 12(a)
FIG. 12(c) is a cross-sectional view taken along line B-B of FIG. 12(a).

Next, Modification Example 3 will be described. Modification Example 3 is a configuration obtained by combining Modification Example 1 and Modification Example 2. FIG. 12 is a diagram illustrating a device structure of a sensor element SE7 in Modification Example 3. Particularly, FIG. 12(a) is a plan view illustrating a device structure of the sensor element SE7 in Modification Example 3, FIG. 12(b) is a cross-sectional view taken along line A-A of FIG. 12(a), and FIG. 12(c) is a cross-sectional view taken along line B-B of FIG. 12(a).

As shown in FIG. 12(a), the sensor element SE7 in Modification Example 3 is configured such that a space is provided inside the movable portion VU1, the inter-digital transducer portion TCU1 and the inter-digital transducer portion TCU2 are formed so as to protrude toward the space side, the fixed electrode FEL1 is provided so as to be opposite to the inter-digital transducer portion TCU1, and that the fixed electrode FEL2 is provided so as to be opposite to the inter-digital transducer portion TCU2. Similarly, a space is provided inside the movable portion VU2, the inter-digital transducer portion TCU3 and the inter-digital transducer portion TCU4 are formed so as to protrude toward this space side, the fixed electrode FEL3 is provided so as to be opposite to the inter-digital transducer portion TCU3, and the fixed electrode FEL4 is provided so as to be opposite to the inter-digital transducer portion TCU4.

In the sensor element SE7 in Modification Example 3 which is configured in this manner, it is also possible to realize a MEMS structure including the MEMS capacitor 1 and the MEMS capacitor 2 shown in FIG. 2.

As described above, while the invention devised by the inventor has been described specifically based on the embodiments thereof, the invention is not limited to the embodiments, and it goes without saying that various changes and modifications may be made without departing from the scope of the invention.

REFERENCE SIGNS LIST

FEL1: FIXED ELECTRODE
FEL2: FIXED ELECTRODE
FEL3: FIXED ELECTRODE
FEL4: FIXED ELECTRODE
MCU: MECHANICAL COUPLING PORTION
MS: MASS BODY
SE: SENSOR ELEMENT
VCAP1: VARIABLE CAPACITIVE ELEMENT
VCAP2: VARIABLE CAPACITIVE ELEMENT
VCAP3: VARIABLE CAPACITIVE ELEMENT
VCAP4: VARIABLE CAPACITIVE ELEMENT
VU1: MOVABLE PORTION
VU2: MOVABLE PORTION

The invention claimed is:

1. An inertial sensor comprising:
a mass body which is displaceable in a first direction, wherein the mass body includes
a first movable portion;
a second movable portion which is electrically isolated from the first movable portion; and
a mechanical coupling portion that mechanically connects the first movable portion and the second movable portion,
wherein the inertial sensor includes
a first fixed electrode which is disposed so as to be opposite to the first movable portion,
a second fixed electrode which is disposed so as to be opposite to the first movable portion,
a third fixed electrode which is disposed so as to be opposite to the second movable portion, and
a fourth fixed electrode which is disposed so as to be opposite to the second movable portion,
wherein a first capacitor is formed by the first movable portion and the first fixed electrode, a second capacitor is formed by the first movable portion and the second fixed electrode, a third capacitor is formed by the second movable portion and the third fixed electrode, and a fourth capacitor is formed by the second movable portion and the fourth fixed electrode,
wherein when the mass body is displaced in the first direction, capacitance of one capacitor out of the first capacitor and the second capacitor increases, whereas capacitance of the other capacitor decreases, and capacitance of one capacitor out of the third capacitor and the fourth capacitor increases, whereas capacitance of the other capacitor decreases, and
wherein one of a left side and a right side of the first movable portion has a plurality of etched cutout portions in one of two conductive layers which constitute said first movable portion, such that a mass of the first movable portion on the left side and a mass of the first movable portion on the right side are different from each other.

2. The inertial sensor according to claim 1, wherein the mechanical coupling portion mechanically connects the first movable portion and the second movable portion which are isolated from each other in a second direction perpendicular to the first direction.

3. The inertial sensor according to claim 1, wherein
a capacitance change of the first capacitor occurs due to a change in an inter-electrode distance between the first movable portion and the first fixed electrode which is caused by displacement of the first movable portion in the first direction,
a capacitance change of the second capacitor occurs due to a change in an inter-electrode distance between the first movable portion and the second fixed electrode which is caused by the displacement of the first movable portion in the first direction,
a capacitance change of the third capacitor occurs due to a change in an inter-electrode distance between the second movable portion and the third fixed electrode which is caused by displacement of the second movable portion in the first direction, and
a capacitance change of the fourth capacitor occurs due to a change in an inter-electrode distance between the second movable portion and the fourth fixed electrode which is caused by the displacement of the second movable portion in the first direction.

4. The inertial sensor according to claim 1, wherein the first movable portion is connected to a first output portion through a first beam, and
the second movable portion is connected to a second output portion through a second beam.

5. The inertial sensor according to claim 4, wherein
the first output portion is disposed at a central portion of the first movable portion when seen in a plan view,
the second output portion is disposed at a central portion of the second movable portion when seen in a plan view, and
a mass of the second movable portion on a left side and a mass of the second movable portion on a right side are different from each other.

* * * * *